United States Patent
Abe et al.

(10) Patent No.: US 9,103,017 B2
(45) Date of Patent: Aug. 11, 2015

(54) ORGANIC DISPLAY PANEL, ORGANIC DISPLAY DEVICE, ORGANIC LIGHT EMITTING DEVICE, METHOD OF MANUFACTURE OF THESE, AND THIN FILM FORMATION METHOD

(71) Applicant: JOLED INC., Tokyo (JP)

(72) Inventors: Yuuki Abe, Hyogo (JP); Kenichi Nendai, Hyogo (JP); Naoko Mizusaki, Osaka (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/355,946

(22) PCT Filed: Nov. 7, 2012

(86) PCT No.: PCT/JP2012/007140
§ 371 (c)(1),
(2) Date: May 2, 2014

(87) PCT Pub. No.: WO2013/069274
PCT Pub. Date: May 16, 2013

(65) Prior Publication Data
US 2014/0312336 A1    Oct. 23, 2014

(30) Foreign Application Priority Data

Nov. 10, 2011 (JP) .................. 2011-246594

(51) Int. Cl.
*H01L 51/52* (2006.01)
*H01L 51/54* (2006.01)
(Continued)

(52) U.S. Cl.
CPC . *C23C 14/08* (2013.01); *C23C 4/08* (2013.01); *C23C 4/105* (2013.01); *C23C 4/18* (2013.01);
(Continued)

(58) Field of Classification Search
None
See application file for complete search history.

(56) References Cited

U.S. PATENT DOCUMENTS 5,443,922 A    8/1995  Nishizaki et al.
8,928,028 B2 * 1/2015  Morishima ................. 257/102
(Continued)

FOREIGN PATENT DOCUMENTS

JP   05-163488   6/1993
JP   2006-294261 10/2006
(Continued)

OTHER PUBLICATIONS

Written Opinion of the International Search Authority PCT/JP2012/00714 dated Feb. 19, 2013.*
(Continued)

*Primary Examiner* — Joseph Schoenholtz
(74) *Attorney, Agent, or Firm* — Greenblum & Bernstein, P.L.C.

(57) ABSTRACT

An organic display panel having a high luminance, and including an organic light emitting element that includes a bottom electrode, a hole-injection layer, an organic light emitting layer, and a top electrode layered in the stated order on a substrate. The bottom electrode is composed of a material that is aluminum, silver, or an alloy including at least one of aluminum and silver. The hole-injection layer contains an oxide of a transition metal. The organic light emitting element further includes a mixed oxidized thin film interposed between and in contact with the bottom electrode and the hole-injection layer, the mixed oxidized thin film being composed of an oxidized mixture of the same material as the material in the bottom electrode and the same transition metal as the transition metal in the hole-injection layer.

20 Claims, 22 Drawing Sheets

(51) Int. Cl.
*H01L 51/56* (2006.01)
*C23C 14/34* (2006.01)
*C23C 14/14* (2006.01)
*C23C 14/08* (2006.01)
*C23C 4/10* (2006.01)
*C23C 4/08* (2006.01)
*C23C 14/00* (2006.01)
*C23C 4/18* (2006.01)
*H01L 51/50* (2006.01)
*H05B 33/10* (2006.01)
*H05B 33/26* (2006.01)
*H01L 51/00* (2006.01)
*H01L 27/32* (2006.01)

(52) U.S. Cl.
CPC ........... *C23C 14/0084* (2013.01); *C23C 14/081* (2013.01); *C23C 14/14* (2013.01); *C23C 14/34* (2013.01); *H01L 51/001* (2013.01); *H01L 51/5008* (2013.01); *H01L 51/5088* (2013.01); *H01L 51/5206* (2013.01); *H05B 33/10* (2013.01); *H05B 33/26* (2013.01); *H01L 27/3246* (2013.01); *H01L 51/5218* (2013.01); *H01L 2251/5315* (2013.01)

(56) References Cited

U.S. PATENT DOCUMENTS

| | | |
|---|---|---|
| 2006/0279190 A1 | 12/2006 | Nakayama |
| 2007/0290604 A1 | 12/2007 | Sakanoue et al. |
| 2008/0116438 A1 | 5/2008 | Lee et al. |
| 2011/0068327 A1* | 3/2011 | Morishima .................... 257/40 |
| 2011/0156079 A1 | 6/2011 | Nakatani et al. |
| 2011/0233572 A1* | 9/2011 | Nakatani et al. ................ 257/88 |
| 2012/0178191 A1 | 7/2012 | Sakanoue et al. |

FOREIGN PATENT DOCUMENTS

| | | |
|---|---|---|
| JP | 2007-005784 | 1/2007 |
| JP | 2007-335737 | 12/2007 |
| JP | 2008-153633 | 7/2008 |
| JP | 2008-244018 | 10/2008 |
| JP | 2009-277788 | 11/2009 |
| JP | 2011-091093 | 5/2011 |
| JP | 2011-107476 | 6/2011 |
| WO | 2010/038356 | 4/2010 |
| WO | 2012/164797 | 12/2012 |

OTHER PUBLICATIONS

International Preliminary Report on Patentability PCT/JP2012/00714 dated Jun. 10, 2014.*
International Search Report for PCT/JP2012/007140, which was mailed on Feb. 19, 2013.

* cited by examiner

FIG. 4A
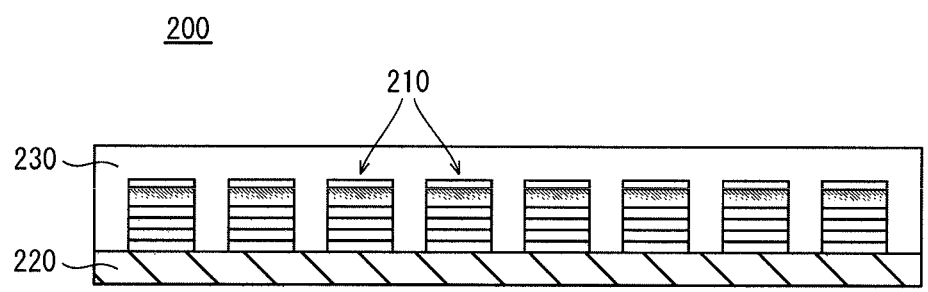
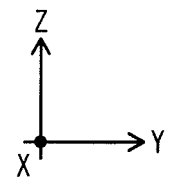
FIG. 4B
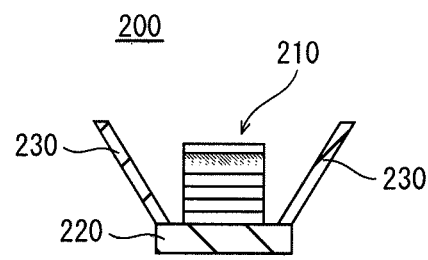
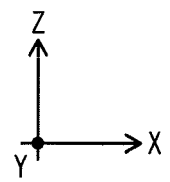

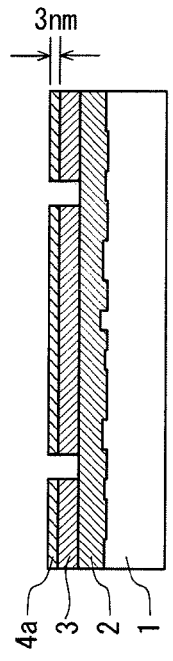
FIG. 5E
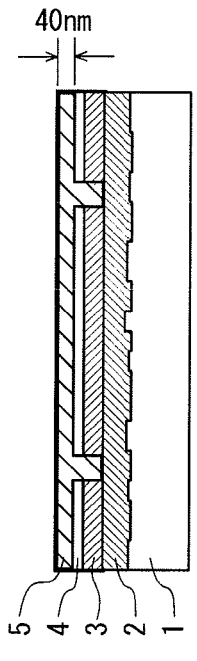
FIG. 5F
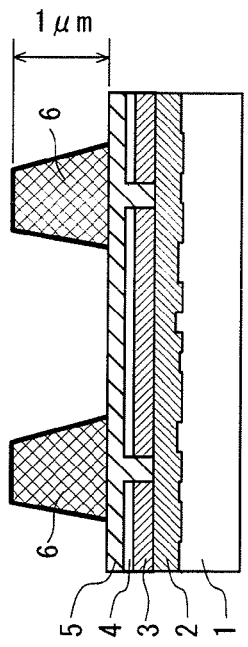
FIG. 5G
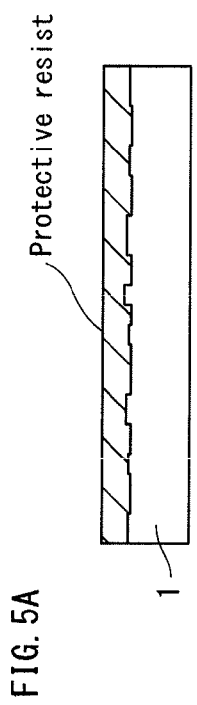
FIG. 5A
FIG. 5B
FIG. 5C
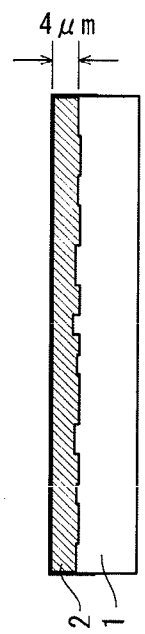
FIG. 5D
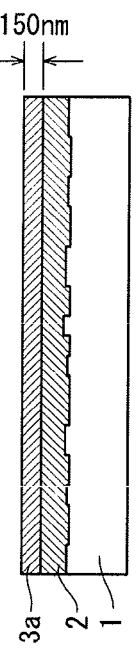

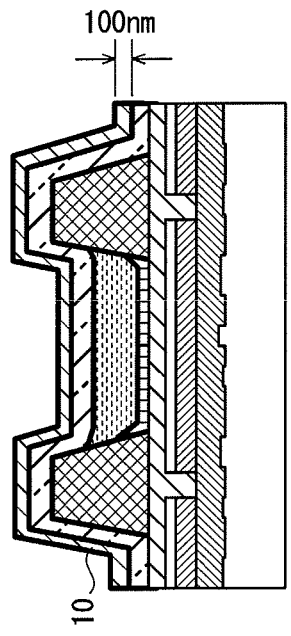
FIG. 6A
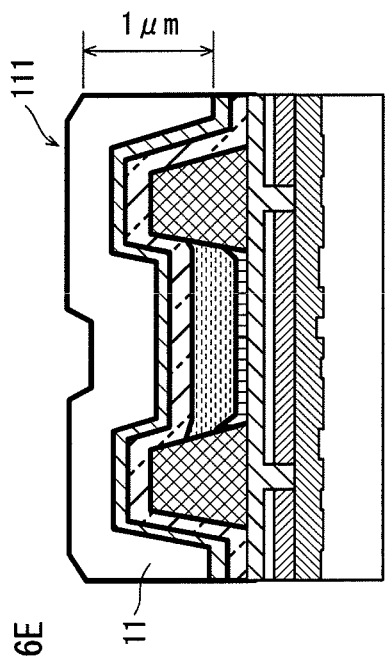
FIG. 6B
FIG. 6C
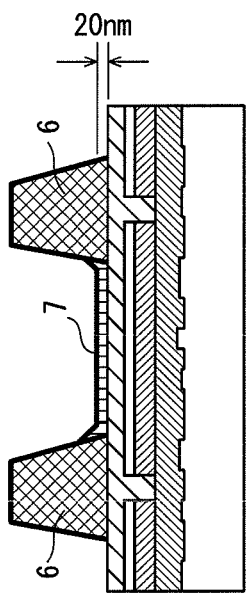
FIG. 6D
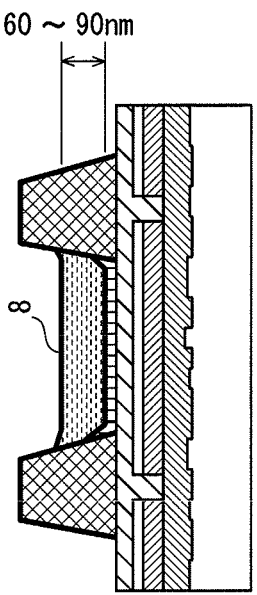
FIG. 6E
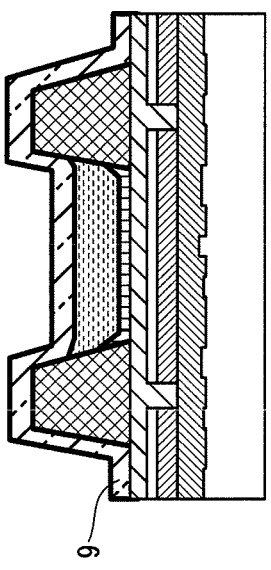

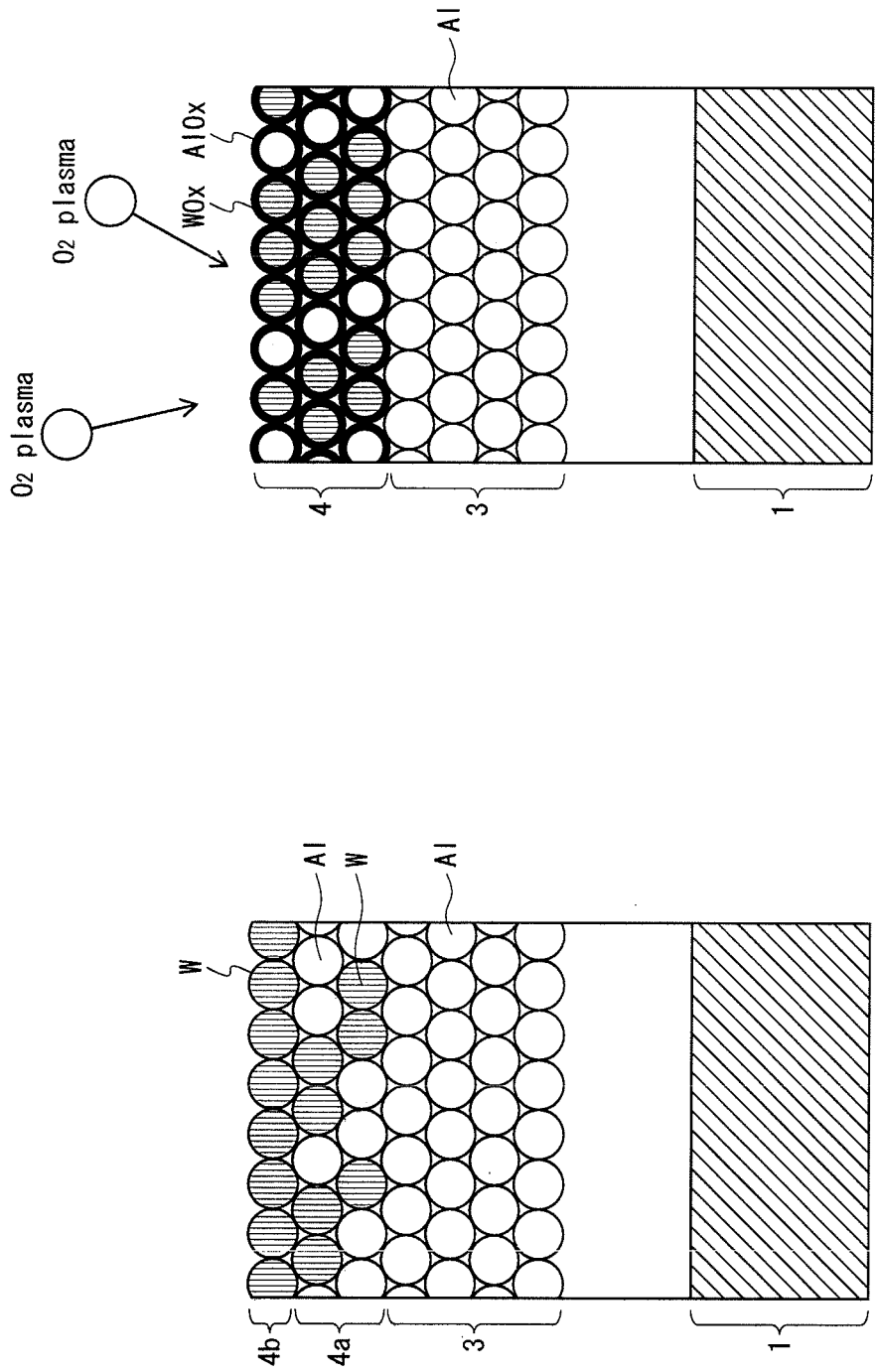

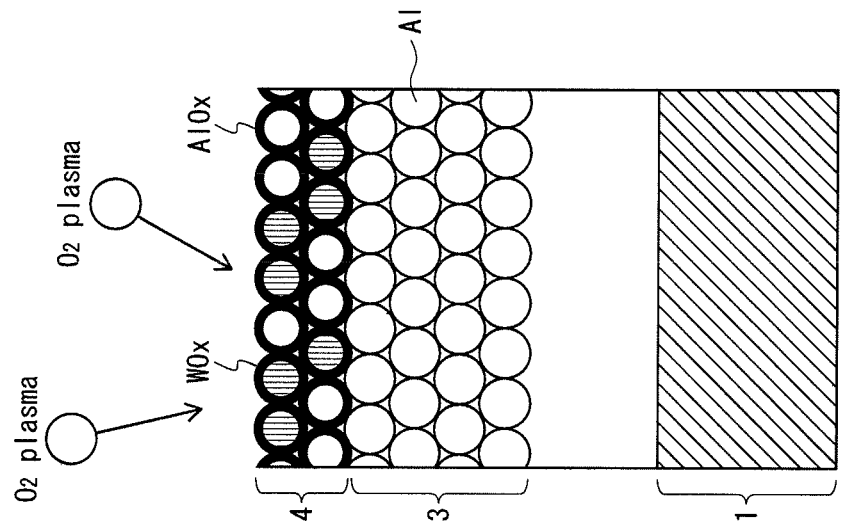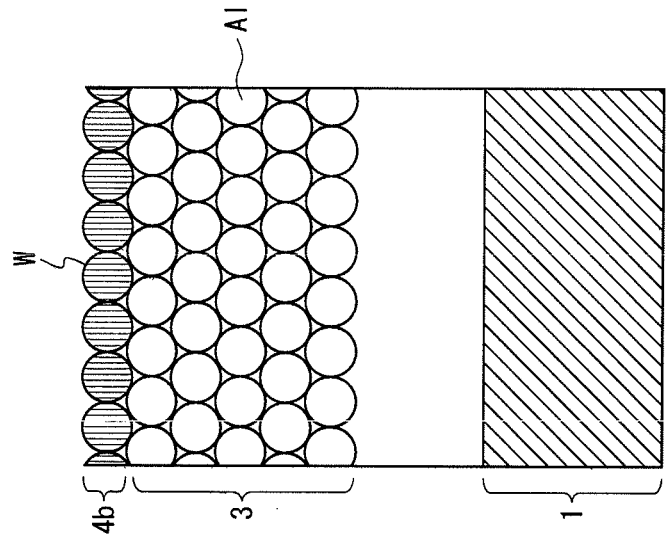

Conventional example 1

- Hole injection layer (WOx)
- Oxidized film (AlOx)
- Bottom electrode (Al)

Conventional example 2

- Transparent electrically conductive layer (IZO)
- Oxidized film (AlOx)
- Bottom electrode (Al)

Implementation example

- Hole injection layer (WOx)
- Mixed oxidized thin film (AlOx-WOx)
- Bottom electrode (Al)

ORGANIC DISPLAY PANEL, ORGANIC DISPLAY DEVICE, ORGANIC LIGHT EMITTING DEVICE, METHOD OF MANUFACTURE OF THESE, AND THIN FILM FORMATION METHOD

TECHNICAL FIELD

The present invention relates to organic display panels, organic display devices, organic light emitting devices, methods of manufacture thereof, and thin film formation methods.

BACKGROUND ART

Organic light emitting elements used as light sources in organic display panels, organic display devices, organic light emitting devices, etc., are light emitting elements that make use of electroluminescence in organic material. In a case of a top emission type organic light emitting element, for example, a thin layer (bottom electrode) composed of aluminium, silver, or similar, is formed on a substrate composed of glass. Further, on the thin layer are layers including a hole-injection layer composed of an oxide of a transition metal, an organic light emitting layer composed of a polymer material, an electron-injection layer composed of barium, and a top electrode composed of aluminium.

The hole-injection layer of such an organic light emitting element is, for example, formed by reactive sputtering using oxygen plasma and a target material composed of a transition metal. Specifically, first, as shown in FIG. 23A, a substrate 904 on which a bottom electrode 903 is formed is set up on a substrate holder 902 that is positioned inside a vacuum container 901, and a target material 906 is set up on a target material holder 905 that is positioned inside the same vacuum container 901. Next, as shown in FIG. 23B, argon gas and oxygen gas is supplied to the vacuum container 901 and sputtering is performed. As a result, as shown in FIG. 23C, a surface of the target material 906 is oxidized, forming a surface layer 906a composed of an oxide of the transition metal, and, as shown in FIG. 23D, the oxide of the surface layer 906a of the target material 906 is transferred to the bottom electrode 903, forming a hole-injection layer 907.

However, oxygen plasma used in reactive sputtering has the characteristic of very easily oxidizing aluminium, silver, etc. Thus, in an organic light emitting element that has the hole-injection layer 907 formed by reactive sputtering, an oxidized film 908 formed by oxidation of aluminium, silver, or similar, is often formed on a surface of the bottom electrode 903. This is a cause of a decrease in light emission efficiency of such an organic light emitting element. For example, when an oxidized film 908 composed of silver oxide is formed, the light emission efficiency of the organic light emitting element is decreased due to the oxidized film 908 impeding light reflection of the bottom electrode 903, which is a reflective electrode. Further, when an oxidized film 908 composed of aluminium oxide is formed, since the oxidized film 908 has a characteristic of high electrical resistance, the drive voltage of the organic light emitting element increases, causing the light emission efficiency of the organic light emitting element to decrease.

Thus, as an organic light emitting element in which formation of the oxidized film 908 on a surface of the bottom electrode 903 is unlikely, an organic light emitting element has been proposed in which a light-transmissive electrically-conductive layer composed of indium tin oxide (ITO) or similar is formed on the bottom electrode 903 (Patent Literature 1).

CITATION LIST

Patent Literature

Patent Literature 1: Japanese Patent Application Publication No. 2009-277788

SUMMARY OF INVENTION

Technical Problem

However, even when a light-transmissive electrically-conductive layer such as described above is formed, if oxygen plasma is used for formation of the light-transmissive electrically-conductive layer, the oxygen plasma results in formation of the oxidized film 908 on the surface of the bottom electrode 903. Further, even if the light-transmissive electrically-conductive layer is formed without using oxygen plasma, if the light-transmissive electrically-conductive layer and the bottom electrode 903 are in contact with each other, the aluminium, silver, or similar at the surface of the bottom electrode 903 takes oxygen from the light-transmissive electrically-conductive layer and oxidizes. Thus, the oxidized film 908 is formed on the surface of the bottom electrode 903. Accordingly, even if the light-transmissive electrically-conductive layer is formed, a decrease in light emission efficiency of the organic light emitting element cannot be sufficiently suppressed. Thus, the reality is that it is difficult to obtain an organic display panel having high luminance.

The present invention, in view of the above problem, has a primary aim of providing an organic display panel, organic display device, and organic light emitting device, all having high luminance, and a method of manufacture thereof. Further, another aim of the present invention is to provide a formation method of a thin film, upon a surface of which formation of an oxidized film is unlikely.

Solution to Problem

In order to achieve the above aims, an organic display panel pertaining to one aspect of the present invention comprises an organic light emitting element that includes a bottom electrode, a hole-injection layer, an organic light emitting layer, and a top electrode layered in the stated order on a substrate, wherein the bottom electrode is composed of a material that is aluminium, silver, or an alloy including at least one of aluminium and silver, the hole-injection layer contains an oxide of a transition metal, and the organic light emitting element further includes a mixed oxidized thin film interposed between and in contact with the bottom electrode and the hole-injection layer, the mixed oxidized thin film being composed of an oxidized mixture of the same material as the material in the bottom electrode and the same transition metal as the transition metal in the hole-injection layer.

Advantageous Effects of Invention

The organic display panel pertaining to one aspect of the present invention has a high luminance, since the mixed oxidized thin film is interposed between and in contact with the bottom electrode and the hole-injection layer. The mixed oxidized thin film is composed of an oxidized mixture of the same material as the material in the bottom electrode, and the same transition metal as the transition metal in the hole-injection layer.

BRIEF DESCRIPTION OF DRAWINGS

FIGS. 4A and 4B are diagrams showing an organic light emitting device pertaining to one aspect of the present invention.

FIGS. 5A through 5G are process diagrams for describing a formation process of an organic light emitting element.

FIGS. 6A through 6E are process diagrams for describing the formation process of the organic light emitting element.

FIGS. 11A and 11B are conceptual diagrams for describing an oxidization process for producing a mixed oxidized thin film pertaining to embodiment 2.

FIGS. 13A and 13B are conceptual diagrams for describing an oxidization process of a mixed oxidized thin film pertaining to embodiment 3.

DETAILED DESCRIPTION

Figure 1:
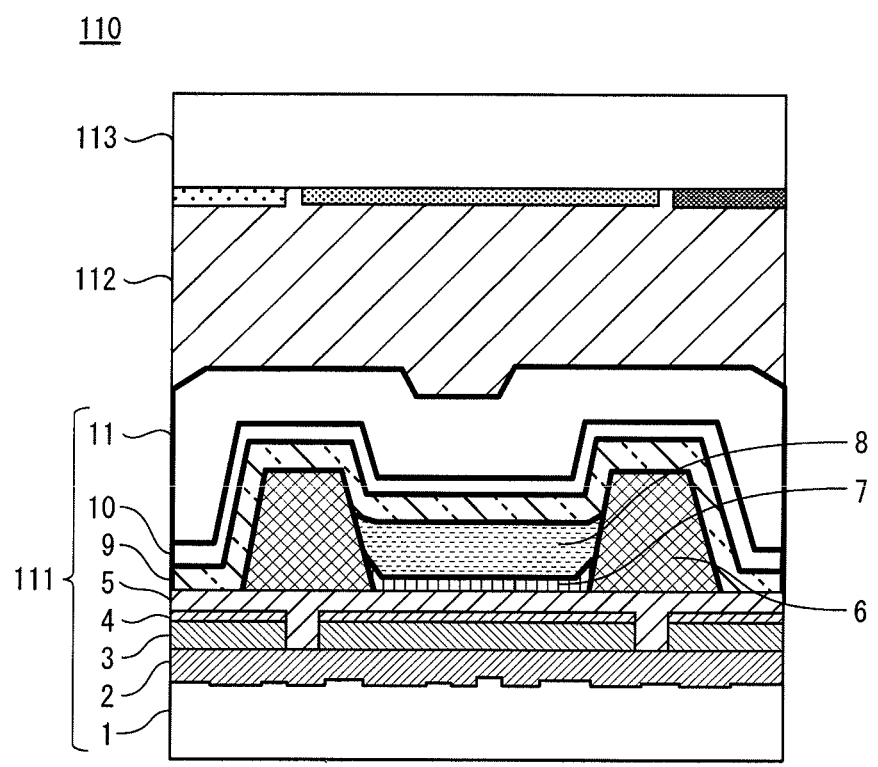
FIG. 1 is a schematic diagram showing an organic display panel pertaining to one aspect of the present invention.

The following is a description of an organic display panel, an organic display device, an organic light emitting device, a method of manufacture thereof, and a thin film formation method, pertaining to aspects of the present invention, and described with reference to the drawings.

[Summary of Aspects of the Present Invention]

The organic display panel pertaining to one aspect of the present invention comprises an organic light emitting element that includes a bottom electrode, a hole-injection layer, an organic light emitting layer, and a top electrode layered in the stated order on a substrate, wherein the bottom electrode is composed of a material that is aluminium, silver, or an alloy including at least one of aluminium and silver, the hole-injection layer contains an oxide of a transition metal, and the organic light emitting element further includes a mixed oxidized thin film interposed between and in contact with the bottom electrode and the hole-injection layer, the mixed oxidized thin film being composed of an oxidized mixture of the same material as the material in the bottom electrode and the same transition metal as the transition metal in the hole-injection layer.

Further, in the organic display panel pertaining to one aspect of the present invention, the mixed oxidized thin film may have a film thickness that allows the transition metal in the mixed oxidized thin film to oxidize into an oxide of the transition metal.

Further, in the organic display panel pertaining to one aspect of the present invention, the transition metal may be tungsten, molybdenum, or nickel.

An organic display device pertaining to one aspect of the present invention comprises an organic light emitting element that includes a bottom electrode, a hole-injection layer, an organic light emitting layer, and a top electrode layered in the stated order on a substrate, wherein the bottom electrode is composed of a material that is aluminium, silver, or an alloy including at least one of aluminium and silver, the hole-injection layer contains an oxide of a transition metal, and the organic light emitting element further includes a mixed oxidized thin film interposed between and in contact with the bottom electrode and the hole-injection layer, the mixed oxidized thin film being composed of an oxidized mixture of the same material as the material in the bottom electrode and the same transition metal as the transition metal in the hole-injection layer.

An organic light emitting device pertaining to one aspect of the present invention comprises an organic light emitting element that includes a bottom electrode, a hole-injection layer, an organic light emitting layer, and a top electrode layered in the stated order on a substrate, wherein the bottom electrode is composed of a material that is aluminium, silver, or an alloy including at least one of aluminium and silver, the hole-injection layer contains an oxide of a transition metal, and the organic light emitting element further includes a mixed oxidized thin film interposed between and in contact with the bottom electrode and the hole-injection layer, the mixed oxidized thin film being composed of an oxidized mixture of the same material as the material in the bottom electrode and the same transition metal as the transition metal in the hole-injection layer.

A manufacturing method of an organic display panel pertaining to one aspect of the present invention comprises: placing in a vacuum container a substrate on which a bottom electrode has been formed and a target member, the bottom electrode being composed of a material that is aluminium, silver, or an alloy including at least one of aluminium and silver, and the target member being composed of a transition metal or an alloy of the transition metal; sputtering the target member under a first condition in which oxygen is not present in the vacuum container or is present at a level that does not oxidize the bottom electrode, depositing sputter particles of the transition metal on a surface of the bottom electrode; and after sputtering under the first condition, sputtering the target member under a second condition in which oxygen is present in the vacuum container at a level that oxidizes the bottom electrode, oxidizing the material and the deposited transition metal in a mixed state and forming a mixed oxidized thin film on the bottom electrode.

A manufacturing method of an organic display device pertaining to one aspect of the present invention comprises: placing in a vacuum container a substrate on which a bottom electrode has been formed and a target member, the bottom electrode being composed of a material that is aluminium, silver, or an alloy including at least one of aluminium and silver, and the target member being composed of a transition metal or an alloy of the transition metal; sputtering the target member under a first condition in which oxygen is not present in the vacuum container or is present at a level that does not oxidize the bottom electrode, depositing sputter particles of the transition metal on a surface of the bottom electrode; and after sputtering under the first condition, sputtering the target member under a second condition in which oxygen is present in the vacuum container at a level that oxidizes the bottom electrode, oxidizing the material and the deposited transition metal in a mixed state and forming a mixed oxidized thin film on the bottom electrode.

A manufacturing method of an organic light emitting device pertaining to one aspect of the present invention comprises: placing in a vacuum container a substrate on which a bottom electrode has been formed and a target member, the bottom electrode being composed of a material that is aluminium, silver, or an alloy including at least one of aluminium and silver, and the target member being composed of a transition metal or an alloy of the transition metal; sputtering the target member under a first condition in which oxygen is not present in the vacuum container or is present at a level that does not oxidize the bottom electrode, depositing sputter particles of the transition metal on a surface of the bottom electrode; and after sputtering under the first condition, sputtering the target member under a second condition in which oxygen is present in the vacuum container at a level that oxidizes the bottom electrode, oxidizing the material and the deposited transition metal in a mixed state and forming a mixed oxidized thin film on the bottom electrode.

A thin film formation method pertaining to one aspect of the present invention comprises: placing in a vacuum container a substrate on which a thin layer has been formed and a target member, the thin layer being composed of a material that is aluminium, silver, or an alloy including at least one of aluminium and silver, and the target member being composed of a transition metal or an alloy of the transition metal; sputtering the target member under a first condition in which oxygen is not present in the vacuum container or is present at a level that does not oxidize the thin layer, depositing sputter particles of the transition metal on a surface of the thin layer; and after sputtering under the first condition, sputtering the target member under a second condition in which oxygen is present in the vacuum container at a level that oxidizes the thin layer, oxidizing the material and the deposited transition metal in a mixed state and forming a mixed oxidized thin film on the thin layer.

Further, in the thin film formation method pertaining to one aspect of the present invention, the sputtering under the first condition may form a mixed layer on the thin layer, the mixed layer being composed of a mix of the material and the transition metal, and the sputtering under the second condition may oxidize the mixed layer, forming the mixed oxidized thin film. Further, in the thin film formation method pertaining to one aspect of the present invention, the mixed layer may have an average thickness equal to or less than 5 nm.

Further, in the thin film formation method pertaining to one aspect of the present invention, the sputtering under the first condition may form a mixed layer and a metal layer on the thin layer, the mixed layer being composed of a mix of the material and the transition metal, the metal layer being composed of the transition metal and formed on the mixed layer, and the sputtering under the second condition may mix and oxidize the mixed layer and the metal layer, forming the mixed oxidized thin film. Further, in the thin film formation method pertaining to one aspect of the present invention, a sum of the average thickness of the mixed layer and the average thickness of the metal layer may be equal to or less than 3 nm, and the average thickness of the metal layer may be equal to or less than 1 nm.

Further, in the thin film formation method pertaining to one aspect of the present invention, the sputtering under the first condition may form a metal layer composed of the transition metal on the thin layer, and the sputtering under the second condition may oxidize the metal layer, forming the mixed oxidized thin film. Further, in the thin film formation method pertaining to one aspect of the present invention, the metal layer may have an average thickness equal to or less than 1 nm.

Further, in the thin film formation method pertaining to one aspect of the present invention, sputtering under the second condition may be performed after the forming of the mixed oxidized thin film, depositing sputter particles of an oxide of the transition metal on the mixed oxidized thin film and forming a transition metal oxide layer on the mixed oxidized thin film. Further, in the thin film formation method pertaining to one aspect of the present invention, the transition metal oxide layer may have hole injection properties. Further, in the thin film formation method pertaining to one aspect of the present invention, the transition metal may be tungsten, molybdenum, or nickel.

Further, in the thin film formation method pertaining to one aspect of the present invention, the sputtering under the first condition may be performed by using plasma of an inert gas. Further, in the thin film formation method pertaining to one aspect of the present invention, the inert gas may be argon gas.

[Organic Display Panel]

FIG. 1 is a schematic diagram showing an organic display panel pertaining to one aspect of the present invention. As shown in FIG. 1, an organic display panel 110 pertaining to one aspect of the present invention is an organic EL display panel that has a structure of a color filter substrate 113 bonded onto an organic light emitting element 111 via a seal material 112.

The organic light emitting element 111 is a top emission type organic light emitting element positioned as an RGB-type sub-pixel in a line state or matrix state. Each sub-pixel has a layered structure in which a planarizing layer 2, a bottom electrode 3, a mixed oxidized thin film 4, a hole-injection layer 5, a bank 6, a hole transport layer 7, an organic light emitting layer 8, an electron transport layer 9, a top electrode 10, and a sealant layer 11 are layered on a substrate 1.

The substrate 1 is, for example, a thin film transistor array substrate. The substrate 1 is formed, for example, by a base substrate and an organic light emitting element drive circuit on the base substrate. The base substrate is composed of an insulating material, such as alkali-free glass, soda glass, non-fluorescent glass, phosphate glass, borate glass, quartz, acrylic resin, styrene resin, polycarbonate resin, epoxy resin, polyethylene, polyester, silicone resin, alumina, etc.

The planarizing layer 2 is, for example, composed of an organic material such as acrylic resin, polyimide resin, novolac phenolic resin, etc. or an inorganic material such as silicon dioxide ($SiO_2$), silicon nitride ($Si_3N_4$), etc. The planarizing layer 2 has a function of ensuring uniformity of thickness of upper layers by planarizing surface unevenness of the substrate 1.

The bottom electrode 3 is one example of a thin layer composed of a metal that is aluminium or silver, or an alloy including at least one of aluminium and silver. For example, the bottom electrode 3 may be composed of an aluminium alloy, a silver alloy, an alloy of silver, palladium, and copper, an alloy of silver, rubidium, and gold, etc. The bottom electrode 3 is a pixel electrode formed in a line state or a matrix state on the planarizing layer 2. Note that in a case in which the bottom electrode 3 is caused to function as a reflective electrode, the bottom electrode 3 is preferably composed of a highly reflective material.

The mixed oxidized thin film 4 is a thin film composed of the material composing the bottom electrode 3, i.e., a metal that is aluminium or silver, or an alloy containing at least one of aluminium or silver (hereafter, "the metal or alloy"), and a transition metal that the hole-injection layer 5 is composed of, oxidized in a mixed state. The mixed oxidized thin film 4 has a function of suppressing oxidization of a surface (the surface facing the mixed oxidized thin film 4) of the bottom electrode 3 that causes formation of an oxide film composed of an oxide of the metal or alloy on the surface of the bottom electrode 3.

Further, the mixed oxidized thin film 4 has a characteristic such that the likelihood is low of oxygen being taken from the mixed oxidized thin film 4 by the metal or alloy of the surface of the bottom electrode 3. Thus, even though the mixed oxidized thin film 4 is in contact with the surface of the bottom electrode 3, oxidization of the surface of the bottom electrode 3 is not accelerated. Furthermore, since the mixed oxidized thin film 4 has a high light transmittance, the mixed oxidized thin film 4 does not interfere with light reflection from the bottom electrode 3. In addition, since the mixed oxidized thin film 4 has a low electrical resistance, the mixed oxidized thin film 4 is unlikely to increase drive voltage. Thus, the mixed oxidized thin film 4 does not decrease the light emission efficiency of the organic light emitting element 111.

The hole-injection layer 5 is composed of an oxide of a transition metal or an oxide of an alloy of the transition metal. Here, the transition metal is an element from group 3 to group 11 on the periodic table. Among the transition metals, a transition metal that has a high hole-injection property after oxidization is preferred, such as tungsten, molybdenum, nickel, titanium, vanadium, chromium, manganese, iron, cobalt, niobium, hafnium, tantalum, etc. In particular, tungsten, molybdenum, and nickel are appropriate for forming the hole-injection layer 5 so as to have a high hole-injection property, since they easily form a hole-injection layer 5 that has oxygen deficiency when sputtering is performed under a condition where oxygen is present.

The bank 6 is, for example, composed of an organic material such as acrylic resin, polyimide resin, novolac phenolic resin, etc., or an inorganic material such as $SiO_2$, $Si_3N_4$, etc. The bank 6 defines a sub-pixel. The hole transport layer 7 and the organic light emitting layer 8 are layered in the stated order in an area defined by the bank 6. Further, the electron transport layer 9, the top electrode 10, and the sealant layer 11 are layered in the stated order, such that they extend beyond the area defined by the bank 6, so as be continuous with the corresponding layers of an adjacent sub-pixel.

The hole transport layer 7 is, for example, composed of poly(3,4-ethylenedioxythiophene)-poly(styrenesulfonate) (PEDOT-PSS), a derivative (copolymer, etc.) of PEDOT-PSS, or similar. The hole transport layer 7 has a function of transporting holes injected from the bottom electrode 3 to the organic light emitting layer 8. The organic light emitting layer 8 is, for example, composed of poly(9,9-di-n-octylfluorene-alt-benzothiadiazole) (F8BT), and has a function of emitting light using electroluminescence.

Note that the organic light emitting layer 8 is not limited to being composed of F8BT, and may have a structure that includes a well-known organic material. For example, the organic light emitting layer 8 may be composed of a fluorescent substance such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group 3 metal, metal complex of oxine, or rare earth complex, as disclosed in Japanese Patent Application Publication No. H5-163488.

The electron transport layer 9 is, for example, composed of barium, phthalocyanine, lithium fluoride, a mix thereof, or similar. The electron transport layer 9 has a function of transporting electrons injected from the top electrode 10 to the organic light emitting layer 8.

The top electrode 10 is, for example, composed of ITO, indium zinc oxide (IZO), or similar. In the case of a top emission type of organic light emitting element, the top electrode 10 is preferably composed of a material that is light transmissive.

The sealant layer 11 is, for example, composed of silicon nitride (SiN), silicon oxynitride (SiON), or similar. The sealant layer 11 has a function of suppressing exposure of the organic light emitting layer 8, etc., to water, air, etc. In the case of a top emission type of organic light emitting element, the sealant layer 11 is preferably formed from a material that is light transmissive.

The organic light emitting element 111 composed of the above structure is characterized in that an oxidized film composed of an oxide of the metal or alloy on the surface of the bottom electrode 3 is not substantially formed. Since an oxidized film on the surface of the bottom electrode 3 is not substantially formed, the organic light emitting element 111 has a high light emission efficiency.

Further, the organic light emitting element 111 is characterized in that the mixed oxidized thin film 4 is interposed between the bottom electrode 3 and the hole-injection layer 5 in a state of contact with the bottom electrode 3 and the hole-injection layer 5. The mixed oxidized thin film 4 is characterized by not accelerating oxidization of the surface of the bottom electrode 3, in addition to not decreasing the light emission efficiency of the organic light emitting element 111 due to having a high light transmittance and low electrical resistance.

[Organic Display Device]

Figure 2:
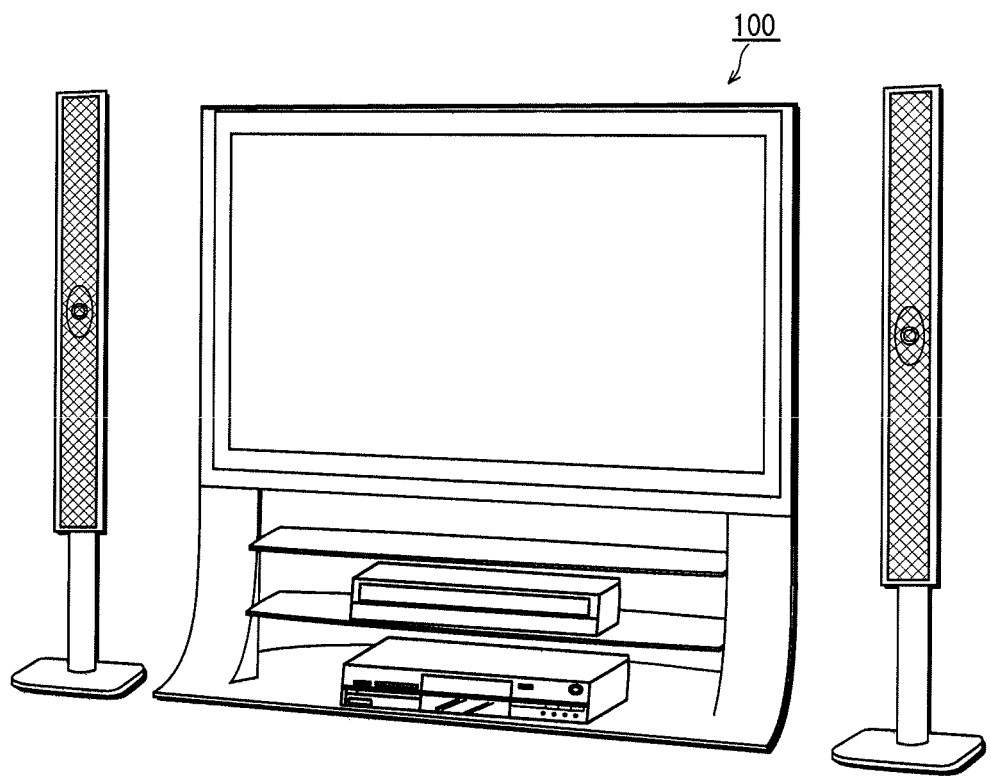
FIG. 2 is a perspective diagram showing a television system using an organic display device pertaining to one aspect of the present invention.

FIG. 2 is a perspective diagram showing a television system using an organic display device pertaining to one aspect of the present invention. As shown in FIG. 2, an organic display device 100 pertaining to one aspect of the present invention is an organic EL display in which pixels that each emit one of red (R), green (G), and blue (B) light are regularly positioned in a matrix in a row direction and a column direction, and each pixel is formed by an organic EL element.

Figure 3:
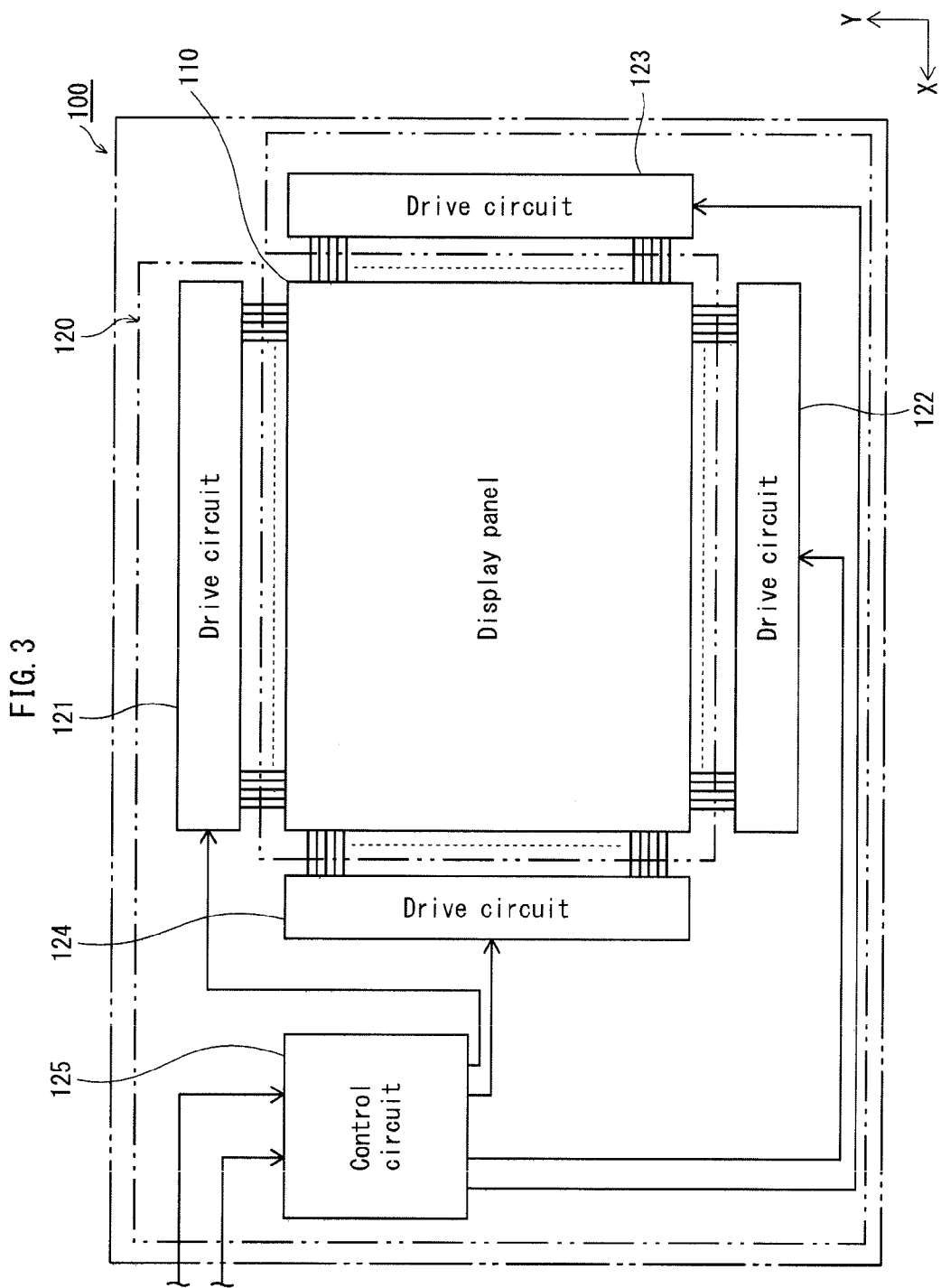
FIG. 3 is a diagram showing an overall structure of the organic display device pertaining to one aspect of the present invention.

FIG. 3 is a diagram showing an overall structure of the organic display device pertaining to one aspect of the present invention. As shown in FIG. 3, the organic display device 100 pertaining to one aspect of the present invention includes the organic display panel 110 and a drive controller 120 that is connected to the organic display panel 110. The drive controller 120 is formed from four drive circuits 121-124, and a control circuit 125. Note that in an actual implementation of the organic display device 100, the positions and connections of the drive controller 120 relative to the organic display panel 110 are not limited in this way.

The organic display device 100 composed of the above structure has a high luminance since it uses the organic light emitting element 111, which has a high light emission efficiency. Note that the organic display device pertaining to one aspect of the present invention is not limited to being an organic EL display device, and may be an inorganic EL display device, or another type of organic display device.

[Organic Light Emitting Device]

FIGS. 4A and 4B are diagrams showing an organic light emitting device pertaining to one aspect of the present invention. FIG. 4A is a longitudinal section and FIG. 4B is a cross-section. As shown in FIGS. 4A and 4B, an organic light emitting device 200 is an organic EL light emitting device formed from a plurality of organic light emitting elements 210 that each have a layered structure similar to that of the organic light emitting element 111, a base 220 on an upper surface of which the organic light emitting elements 210 are mounted, and a pair of reflective members 230 that are attached to the base 220 so that the organic light emitting elements 210 are positioned therebetween. Each of the organic light emitting elements 210 is electrically connected to a conductive pattern (not illustrated) formed on the base 220, and emits light due to drive power supplied by the conductive pattern. A portion of light emitted from each organic light emitting element 210 is redistributed by the reflective members 230.

The organic light emitting device 200 composed of the above structure has a high luminance since it uses the organic light emitting elements 210, which have a high light emission efficiency. Note that the organic light emitting device pertaining to one aspect of the present invention is not limited to being an organic EL light emitting device, and may be an inorganic EL light emitting device, or another type of organic light emitting device.

[Method of Manufacture of Organic Display Panel, Organic Display Device, and Organic Light Emitting Device]

A method of manufacture of the organic display panel, the organic display device, and the organic light emitting device, each of which pertains to one aspect of the present invention, is characterized by a formation process of an organic light emitting element thereof, and therefore only the formation process of the organic light emitting element is described below. FIGS. 5A-5G and 6A-6E are process diagrams for describing the formation process of the organic light emitting element.

In the formation process of the organic light emitting element, first, the substrate 1 is prepared, which has a protective resist protecting an upper surface thereof as shown in FIG. 5A.

Next, as shown in FIG. 5B, the protective resist covering the substrate 1 is stripped off.

Next, as shown in FIG. 5C, the planarizing layer 2 (having a thickness of, for example, 3-4.5 µm) is formed on the substrate 1, by performing a spin coating of organic resin, and photoresist/photo etching (PR/PE) patterning.

Next, as shown in FIG. 5D, a thin layer 3a containing aluminium or silver is formed on the planarizing layer 2. The thin layer 3a is, for example, formed from APC by performing sputtering using APC and has, for example, a thickness of 100-400 nm. Note that the thin layer 3a may be formed by vacuum deposition, etc.

Next, as shown in FIG. 5E, by using the second process of the thin film formation method pertaining to one aspect of the present invention, a layer (having a thickness of, for example, equal to or less than 5 nm) composed of a mix of the aluminium or silver in the thin layer 3a and a transition metal is formed on the thin layer 3a. By patterning the layer and the thin layer 3a in a matrix using PR/PE, a mixed layer 4a and the bottom electrode 3 are formed. The second process is described in detail later in this document.

Next, as shown in FIG. 5F, by using the third process of the thin film formation method pertaining to one aspect of the present invention, the mixed layer 4a is oxidized to form the mixed oxidized thin film 4 (having a thickness of, for example, equal to or less than 5 nm), and the hole-injection layer 5 is formed from above the mixed oxidized thin film 4. The third process is described in detail later in this document.

Note that the hole-injection layer 5 is not only formed above the bottom electrode 3, but is formed above the entire upper surface of the substrate 1. The hole-injection layer 5 is formed by (i) forming a layer composed of an oxide of a transition metal by reactive sputtering and (ii) patterning the layer by PR/PE. The hole-injection layer 5 has, for example, a thickness of 5-50 nm.

Next, as shown in FIG. 5G, the bank 6 is formed on the hole-injection layer 5. An area on the hole-injection layer 5 in which the bank 6 is formed 5 is an area corresponding to a boundary between areas in which adjacent organic light emitting layers are to be formed. The bank 6 is formed by (i) forming a bank material layer covering the entirety of the hole-injection layer 5 and (ii) removing a portion of the bank material layer so formed by PR/PE. The bank 6 has, for example, a thickness of 1-1.5 µm. Note that the bank 6 may extend in the row direction or column direction, forming a stripe in a line bank structure. Alternatively, the bank 6 may extend in the row direction and the column direction, forming a pixel bank structure, which has a grid shape in plan view.

Next, as shown in FIG. 6A, the hole transport layer 7 is formed by filling a concavity bounded by the bank 6 with ink that includes material for a hole transport layer, then desiccating the ink. The hole transport layer 7 has, for example, a thickness of 10-50 nm.

Next, as shown in FIG. 6B, the organic light emitting layer 8 is formed by (i) filling, by an inkjet method, the concavity bounded by the bank 6 with ink for an organic light emitting element, (ii) desiccating the ink in, for example, a 25° C. environment under reduced pressure, and (iii) a baking process. The organic light emitting layer 8 has, for example, a thickness of 50-150 nm. Note that a method of filling the concavity bounded by the bank 6 with ink is not limited to the inkjet method, and may be a dispenser method, a nozzle coating method, a spin coating method, intaglio printing, relief printing, etc.

Next, as shown in FIG. 6C, the electron transport layer 9 is formed via vapor deposition so as to cover the bank 6 and the organic light emitting layer 8. The electron transport layer 9 has a thickness of 50-150 nm.

Next, as shown in FIG. 6D, the top electrode 10 is formed on the electron transport layer 9. The top electrode 10 has a different polarity to the bottom electrode 3. Specifically, the top electrode 10 is formed on the electron transport layer 9 by vapor deposition of a light transmissive material. The top electrode 10 has a thickness of 5-100 nm.

Next, as shown in FIG. 6E, the sealant layer 11 is formed on the top electrode 10, by CVD. The sealant layer 11 has a thickness of 0.5-7 μm.

According to the above, the organic light emitting element 111, which is a top emission type, is completed.

[Thin Film Formation Device]

Figure 7:
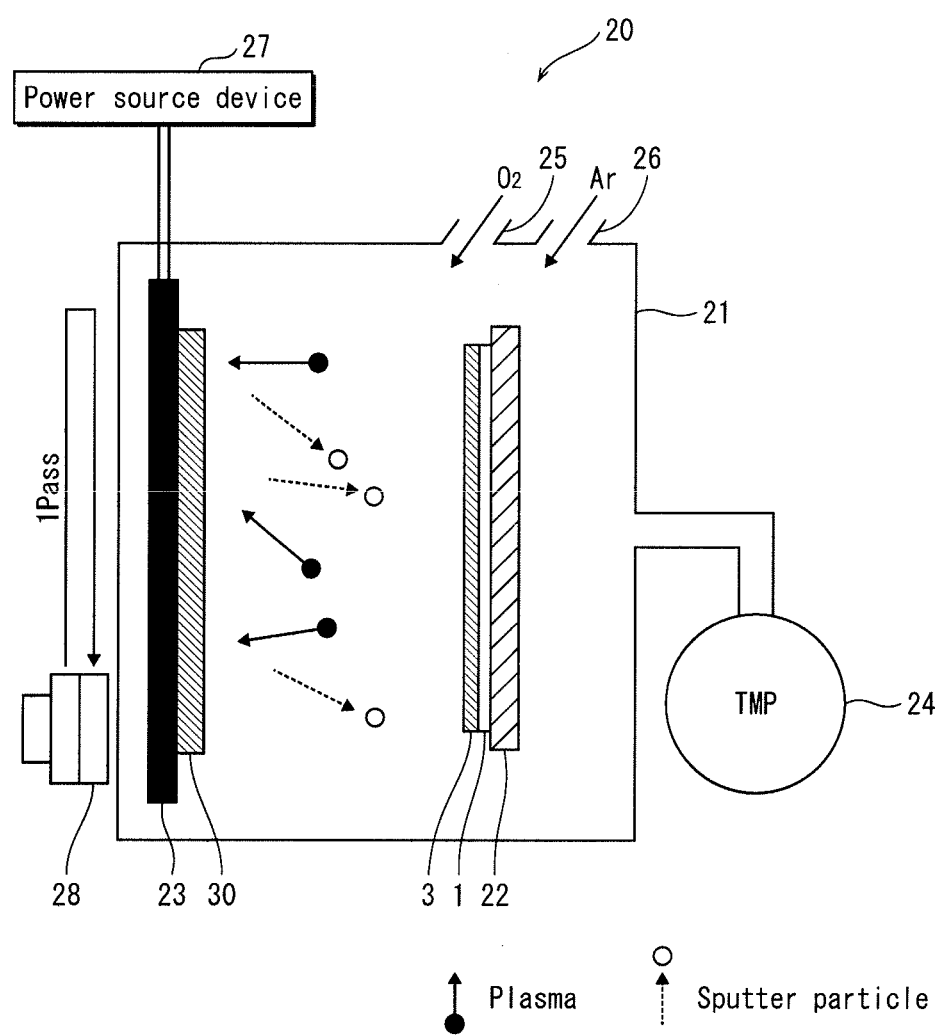
FIG. 7 is a schematic diagram showing a thin film formation device.

FIG. 7 is a schematic diagram showing a thin film formation device pertaining to one aspect of the present invention. As shown in FIG. 7, a thin film formation device 20 is a magnetron sputtering device and includes, for example: a vacuum container 21; a substrate holder 22 and a target holder 23 inside the vacuum container 21; a turbomolecular pump 24 for evacuating the inside of the vacuum container 21 to a vacuum state; an oxygen gas supplier 25 for supplying oxygen gas to the inside of the vacuum container 21; an inert gas supplier 26 for supplying inert gas to the inside of the vacuum container 21; a power supply device 27 for generating plasma; and a magnet 28 for forming a desired magnetron magnetic field above a surface of a target material 30.

The substrate holder 22 is a flat plate for holding the substrate 1 after formation of the bottom electrode 3 (in FIG. 7, the planarizing layer 2 is not shown). When sputtering is performed, the substrate holder 22 has a function as a ground electrode. The target holder 23 is a flat plate for holding the target material 30. When sputtering is performed, the target holder 23 has a function as a power supply electrode. Voltage is applied by the power supply device 27 between the substrate holder 22 and the target holder 23, generating plasma in the vacuum container 21.

The magnet 28 is positioned on a side of the target holder 23 opposite the side of the target holder 23 that the target material 30 is positioned on. The magnet 28 is passed back and forth relative to the target holder 23 as indicated by an arrow in FIG. 7. A magnetic field is applied to a surface of the target material 30 by the magnet 28, generating high-density plasma in the vicinity of the target material 30. Thus a rate of film formation is sped up. Further, kinetic energy of electrons due to ionizing collisions is sufficiently reduced when escaping from the magnetic field and until incident on the substrate 1 that a temperature increase of the substrate 1 is suppressed.

Note that the thin film formation device pertaining to one aspect of the present invention is not limited to being a magnetron sputtering device, and may, for example, be an ion beam sputtering device, etc.

[Thin Film Formation Method]

<Thin Film Formation Method Pertaining to Embodiment 1>

In a thin film formation method pertaining to embodiment 1, a first process, a second process, and a third process are performed in the stated order. The first process, the second process, and the third process are described below. FIGS. 8A through 8G are process diagrams for describing the thin film formation method pertaining to embodiment 1. The first process, the second process, and the third process are described using FIGS. 8A through 8G.

(First Process)

Figure 8A:
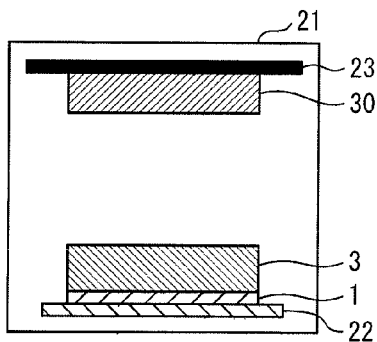
FIGS. 8A through 8G are process diagrams for describing a thin film formation method pertaining to embodiment 1.

In the first process, as shown in FIG. 8A, the substrate 1, on which is formed the bottom electrode 3 (thin layer) composed of aluminium, silver, or an alloy including at least one of aluminium and silver, is placed on the substrate holder 22. Also, the target material 30 composed of a transition metal or an alloy of the transition metal is placed on the target holder 23. In the vacuum container 21, the substrate 1 and the target material 30 are made to face each other.

As the transition metal or the transition metal component of the alloy in the target material 30, a transition metal that has a high hole-injection property after oxidization is preferred, such as tungsten, molybdenum, nickel, titanium, vanadium, chromium, manganese, iron, cobalt, niobium, hafnium, tantalum, etc. In particular, oxygen deficiency of tungsten, molybdenum, and nickel easily occurs when sputtering of the target material is performed in the presence of oxygen (hereafter, "reactive sputtering"). Thus, tungsten, molybdenum, and nickel have a high hole injection property and are preferred as the transition metal.

(Second Process)

Figure 8E:
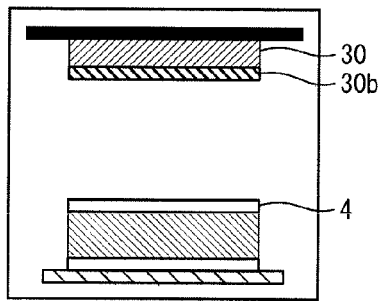
Figure 8B:
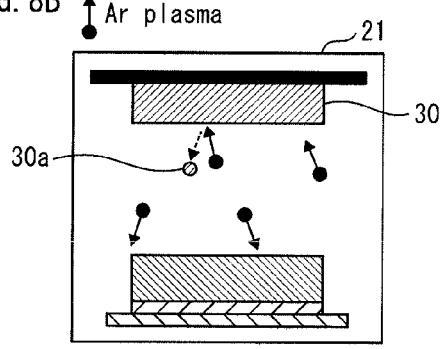

In the second process, as shown in FIG. 8B, sputtering is performed on the target material 30 under a condition in which oxygen is not present in the vacuum container 21, or oxygen is present at a level that does not oxidize the bottom electrode 3. Thus, in the second process, a mixed layer 4a is formed on the bottom electrode 3, as shown in FIG. 8C, by causing sputter particles 30a of the transition metal to be deposited on the surface of the bottom electrode 3.

Specifically, after the inside of the vacuum container 21 is evacuated to a vacuum state, inert gas is supplied, and sputtering is performed using plasma of the inert gas, scattering the sputter particles 30a of the transition metal of the target material 30 and depositing the sputter particles 30a on the surface of the bottom electrode 3.

In the case of argon sputtering using argon gas as the inert gas, for example, a tungsten flat plate having a size of 670 mm×710 mm×8 mm may be used as the target material 30, and sputtering may be performed under the conditions: power: 1.3 kW, pressure: 5.0 Pa, and argon flow rate: 200 sccm.

In this way, by supplying only an inert gas such as argon to the inside of the vacuum container 21, the condition of no oxygen being present in the vacuum container 21 is achieved. On the other hand, oxygen may be present in the vacuum container 21 at a level that does not oxidize the bottom electrode 3, and this condition also allows suppression of an oxidized film forming on the surface of the bottom electrode 3. As a specific example of the condition of oxygen being present in the vacuum container 21 at a level that does not oxidize the bottom electrode 3, a degree of vacuum achievable via a cryopump may be considered. As long as the gas supplied to the inside of the vacuum container 21 has a partial pressure of oxygen less than or equal to $1.0 \times 10^{-9}$, the condition is met of oxygen being present in the vacuum container 21 at a level at which substantially no oxidization of the bottom electrode 3 occurs.

When sputter particles 30a are deposited on the surface of the bottom electrode 3, ion bombardment, which is the result of impacts due to sputtering power, causes the metal or alloy in the bottom electrode 3 and the transition metal in the sputter particles 30a to be mixed, forming the mixed layer 4a on the bottom electrode 3 as shown in FIG. 8C.

An amount of sputter particles 30a deposited on the surface of the bottom electrode 3 may be considered in terms of a theoretical case in which ion bombardment does not occur (a case in which the metal or alloy in the bottom electrode 3 and the transition metal in the sputter particles 30a do not mix). The amount of sputter particles 30a to be deposited on the surface of the bottom electrode 3 is preferably an amount that would, in such a case, form a metal layer composed of the transition metal having an average thickness equal to or less than 1 nm on the bottom electrode 3. In other words, depositing an amount of sputter particles 30a that would result in a metal layer having an average thickness equal to or less than 1 nm on a glass substrate is preferable.

When the amount of sputter particles 30a deposited would result in a metal layer having an average thickness equal to or less than 1 nm on a glass substrate, this amount of sputter particles 30a forms the mixed layer 4a having an average thickness equal to or less than 5 nm, even if all of the sputter particles 30a become part of the mixed layer 4a due to the ion bombardment. When the average thickness of the mixed layer 4a is equal to or less than 5 nm, the transition metal in the mixed layer 4a is sufficiently oxidized. For this reason, the average thickness of the mixed layer 4a pry to or less than 5 nm, and the amount of the sputter particles 30a to be deposited is preferably the amount that would result in a metal layer having an average thickness equal to or less than 1 nm on a glass substrate. Note that the amount of the sputter particles 30a deposited is adjustable by adjusting sputtering conditions.

(Third Process)

Figure 8F:
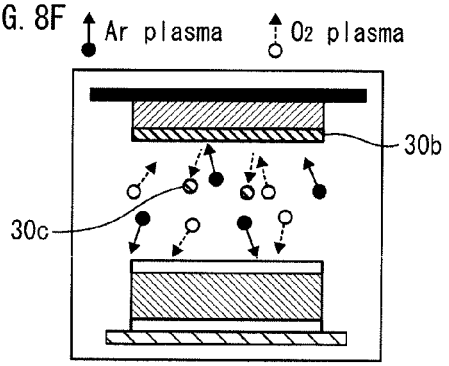
Figure 8C:
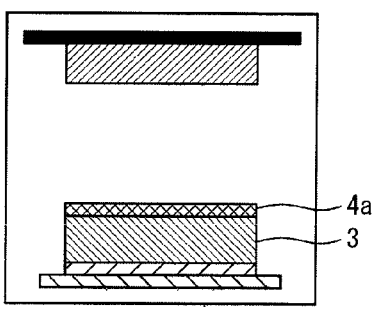
Figure 8G:
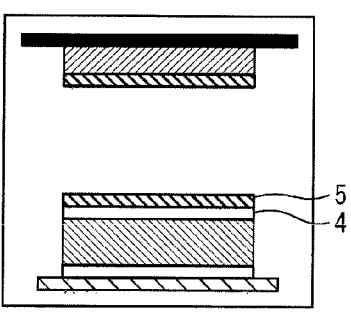
Figure 8D:
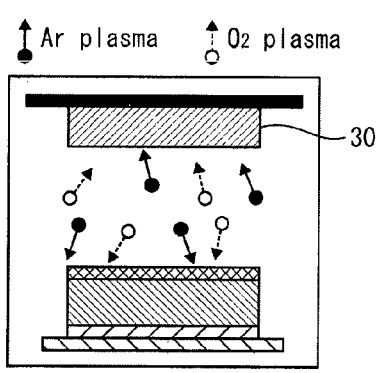

In the third process, after the second process, sputtering (reactive sputtering) is performed on the target material 30 under a condition in which oxygen is present in the vacuum container 21, as shown in FIG. 8D, oxidizing the mixed layer 4a and forming the mixed oxidized thin film 4, as shown in FIG. 8E.

Specifically, by beginning to supply oxygen gas while continuing to perform sputtering after the second process, sputtering is performed under a condition in which a mixed gas of inert gas and oxygen gas is present in the vacuum container 21, causing an oxygen plasma process on the mixed layer 4a. In this way, the mixed layer 4a is oxidized, forming the mixed oxidized thin film 4.

In the case of reactive sputtering using argon gas and oxygen gas, for example, as the target material 30 a tungsten flat plate having a size of 670 mm×710 mm×8 mm may be used, and sputtering may be performed under the conditions: power: 1.3 kW, pressure: 4.7 Pa, argon flow rate: 100 sccm, and oxygen flow rate: 100 sccm. As long as the reactive sputtering is performed for at least 300 seconds, the metal or alloy, and the transition metal in the mixed layer 4a are sufficiently oxidized.

Note that for the reactive sputtering, supplying a mixed gas of oxygen gas and argon gas into the vacuum container 21 is not necessarily required as long as a mixed gas is supplied that includes oxygen gas and enables the oxygen plasma process. In a case in which a mixed gas that includes oxygen gas is supplied, the oxygen gas preferably has a concentration equal to or greater than 50 wt %. However, considering that a concentration of oxygen gas is sufficient when equal to or greater than 25 wt % in a case in which a hole-injection layer composed of oxidized tungsten is formed by reactive sputtering, the concentration of oxygen gas that includes oxygen gas in the third process should be sufficient when equal to or greater than 25 wt %. Note that supplying only oxygen gas into the vacuum container 21 is possible.

Even though reactive sputtering is performed in the third process, since the mixed layer 4a is already formed on the surface of the bottom electrode 3, the surface of the bottom electrode 3 is hardly exposed to the oxygen plasma, and oxidization of the surface of the bottom electrode 3 is unlikely. Accordingly, after formation of the mixed layer 4a, layering the next layer is possible without fear of oxidization of the surface of the bottom electrode 3.

(Process of Forming Transition Metal Oxide Layer)

In embodiment 1, a process of forming a transition metal oxide layer is performed during the third process.

When the reactive sputtering of the third process is performed, the surface of the target material 30 is oxidized due to the oxygen plasma, thus forming a surface layer 30b containing a transition metal oxide as shown in FIG. 8E. Here, by further performing the reactive sputtering, the target material 30 is sputtered, and sputter particles of the transition metal oxide are deposited on the mixed oxidized thin film 4, forming a transition metal oxide layer thereon.

Specifically, as shown in FIG. 8F for example, under conditions in which the mixed gas of the inert gas and the oxygen gas are present in the vacuum container 21 the surface layer 30b of the surface of the target material 30 is sputtered, causing sputter particles 30c of the transition metal oxide to scatter from the surface layer 30b of the target material 30, and causing the sputter particles 30c to be deposited on the mixed oxidized thin film 4. Thus, the hole-injection layer 5 is formed, composed of the transition metal oxide on the surface of the mixed oxidized thin film 4, as shown in FIG. 8G.

In the case of reactive sputtering using argon gas and oxygen gas, for example, as the target material 30 a tungsten flat plate having a size of 670 mm×710 mm×8 mm may be used, and sputtering may be performed under the conditions: power: 1.3 kW, pressure: 4.7 Pa, argon flow rate: 100 sccm, and oxygen flow rate: 100 sccm. It is preferable that tungsten oxide ($WO_x$) that is caused to be deposited is oxidized such that x has a value from 2.5 to 2.9. This is because the hole-injection layer 5 has a high oxygen deficiency and a high hole-injection property when composed of such tungsten oxide.

When the process of forming the transition metal oxide layer is performed in the third process as described above, the hole-injection layer 5 is formed following on from the formation of the mixed oxidized thin film 4, simplifying the overall process.

(Oxidization Process of Mixed Oxidized Thin Film)

Figure 9B:
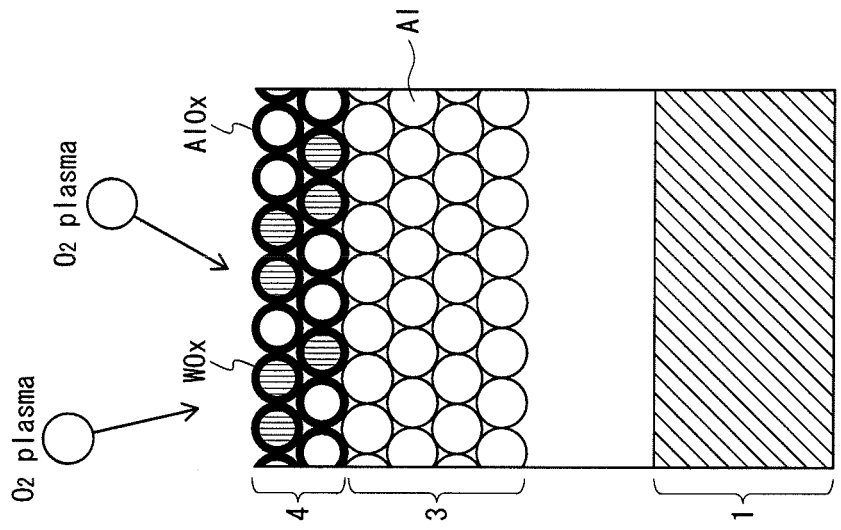
FIGS. 9A and 9B are conceptual diagrams for describing an oxidization process for producing a mixed oxidized thin film pertaining to embodiment 1.
Figure 9A:
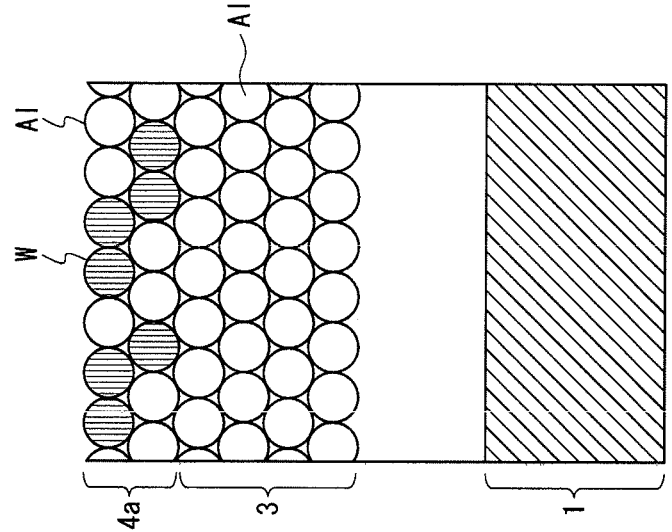

FIGS. 9A and 9B are conceptual diagrams for describing the oxidization process for producing the mixed oxidized thin film pertaining to embodiment 1. In the second process, by depositing sputter particles composed of tungsten on the surface of the bottom electrode 3 composed of aluminium, for example, the mixed layer 4a is formed as shown in FIG. 9A. The mixed layer 4a is formed by tungsten in the sputter particles mixing with aluminium in the bottom electrode 3 to a depth of several nanometers due to the ion bombardment. In this state, by further performing reactive sputtering in the third process, as shown in FIG. 9B, the oxygen plasma process causes the mixed layer 4a to be oxidized, leading to formation of the mixed oxidized thin film 4. Note that in the case of forming the transition metal oxide layer in the third process, the mixed layer 4a is also oxidized by the transition metal oxide that is deposited thereon.

The mixed oxidized thin film 4 formed in this way preferably has a film thickness that allows the transition metal in the mixed layer 4a to oxidize into an oxide of the transition metal. As long as the mixed oxidized thin film 4 has such a thickness, the transition metal in the mixed oxidized thin film 4 has a high chance of being sufficiently oxidized. As described above, when the average thickness of the mixed layer 4a is equal to or less than 5 nm, the transition metal in the mixed layer 4a is sufficiently oxidized. Thus, the film thickness is, for example, an average thickness equal to or less than 5 nm in the thin film formation method pertaining to embodiment 1, such that oxidization of the transition metal by the transition metal oxide is possible.

When a tungsten atom (W) is exposed on the surface of the bottom electrode 3 while the mixed layer 4a is being oxidized, the atom becomes tungsten oxide ($WO_X$), and oxidization of an aluminium atom (Al) below the $WO_X$ is suppressed. On the other hand, when an aluminium atom (Al) is exposed on the surface of the bottom electrode 3 while the mixed layer 4a is being oxidized, the atom becomes aluminium oxide ($AlO_X$) and has insulation properties. However, since Al and W that is impacted into the mixed layer 4a under the $AlO_X$ suppresses propagation of oxidation due to the redox potential difference between W and Al, oxidization of the surface of the bottom electrode 3 is not accelerated, and the mixed oxidized thin film 4 does not become an insulating layer.

(Summary)

According to the above-described processes, in the thin film formation method pertaining to the first embodiment, the mixed oxidized thin film 4 is formed on the bottom electrode 3 without oxidizing the surface of the bottom electrode 3.

Note that in the third process, the process of forming the transition metal oxide layer is not required. In other words, the mixed oxidized thin film 4 and the hole-injection layer 5 need not be formed consecutively, and the third process need only include the formation of the mixed oxidized thin film 4. Further, processing after the third process is not specifically limited. When the mixed oxidized thin film 4 is formed, oxidization of the surface of the bottom electrode 3 is suppressed, and therefore there is no need to fear oxidization of the surface of the bottom electrode 3 from the next process onward.

<Thin Film Formation Method Pertaining to Embodiment 2>

A thin film formation method pertaining to embodiment 2 is very different from the thin film formation method pertaining to embodiment 1 in that, in the second process, a metal layer 4b is further formed on the mixed layer 4a. The metal layer 4b is not formed in the thin film formation method pertaining to embodiment 1. Only this difference is described below, and other points are abbreviated.

In the thin film formation method pertaining to embodiment 2, a first process, a second process, and a third process are performed in the stated order. The first process, the second process, and the third process are described below. FIGS. 10A through 10H are process diagrams for describing the thin film formation method pertaining to one aspect of the present invention. The first process, the second process, and the third process described using FIGS. 10A through 10H.

Figure 10A:
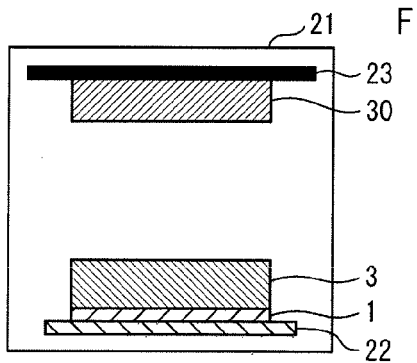
FIGS. 10A through 10H are process diagrams for describing a thin film formation method pertaining to embodiment 2.

In the first process, as in embodiment 1 and as shown in FIG. 10A, the substrate 1, on which is formed the bottom electrode 3 composed of the metal or alloy is placed on the substrate holder 22. Also, the target material 30 composed of a transition metal or an alloy of the transition metal is placed on the target holder 23. In the vacuum container 21, the substrate 1 and the target material 30 are made to face each other.

Figure 10E:
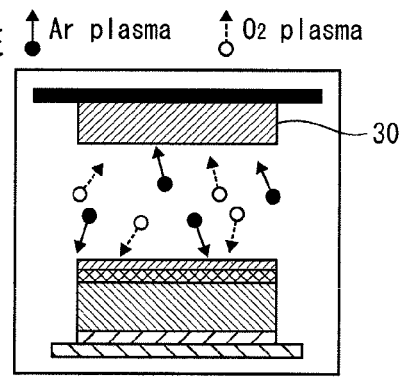
Figure 10B:
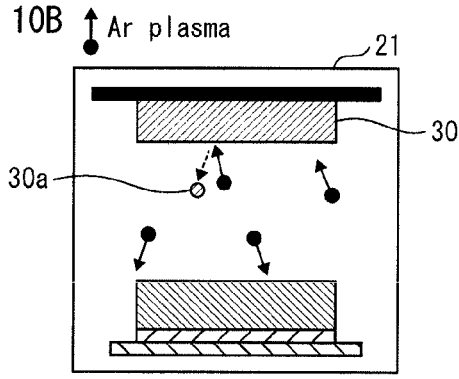
Figure 10F:
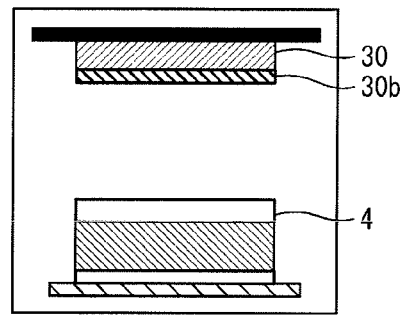
Figure 10C:
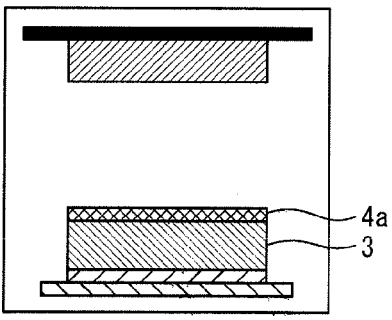

In the second process, as shown in FIG. 10B, under a condition in which oxygen is not present in the vacuum container 21, or oxygen is present at a level that does not oxidize the bottom electrode 3, sputtering is performed on the target material 30, causing sputter particles 30a of the transition metal to be deposited on the surface of the bottom electrode 3. As shown in FIG. 10C, a mixed layer 4a is formed on the bottom electrode 3, and further, as shown in FIG. 10D, a metal layer 4b is formed on the mixed layer 4a.

Specifically, when causing the sputter particles 30a to be deposited on the surface of the bottom electrode 3, the metal or alloy in the bottom electrode 3 and the transition metal in the sputter particles 30a are mixed by the ion bombardment, thereby forming the mixed layer 4a on the bottom electrode 3. By further causing the sputter particles 30a to be deposited, the metal layer 4b, which is composed of the transition metal in the sputter particles 30a, is formed on the mixed layer 4a.

The average film thickness of the metal layer 4b is preferably equal to or less than 1 nm. As long as the average film thickness of the metal layer 4b is equal to or less than 1 nm, the transition metal in the metal layer 4b can be mixed with the metal or alloy and the transition metal in the mixed layer 4a by the ion bombardment caused by the sputtering of the third process. Further, the sum of the average thickness of the mixed layer 4a and the average thickness of the metal layer 4b is preferably equal to or less than 3 nm. As long as the sum of the average thickness is equal to or less than 3 nm, the transition metal in the mixed layer 4a and the metal layer 4b can be sufficiently oxidized. Note that the average film thickness of the mixed layer 4a and the metal layer 4b is adjustable by adjusting sputtering conditions.

In the third process, after the second process, the target material 30 is sputtered under a condition in which oxygen is present in the vacuum container 21, as shown in FIG. 10E. In the third process, the mixed layer 4a and the metal layer 4b are oxidized, forming the mixed oxidized thin film 4, as shown in FIG. 10F. The mixed oxidized thin film 4 formed in this way preferably has a film thickness that allows the transition metal in the mixed layer 4a and the metal layer 4b to oxidize into an oxide of the transition metal. As long as the mixed oxidized thin film 4 has such a thickness, the transition metal in the mixed oxidized thin film 4 has a high chance of being sufficiently oxidized. As described above, when the sum of the average thickness of the mixed layer 4a and the metal layer 4b is equal to or less than 3 nm, the transition metal in the mixed layer 4a and the metal layer 4b is sufficiently oxidized. Thus, the film thickness is, for example, an average thickness equal to or less than 3 nm in the thin film formation method pertaining to embodiment 2, such that oxidization of the transition metal to the transition metal oxide is possible.

Specifically, the oxygen plasma process is performed while mixing the transition metal in the metal layer 4b, and the metal or alloy and the transition metal in the mixed layer 4a due to the ion bombardment caused by sputtering. In this way, the mixed layer 4a and the metal layer 4b are mixed and oxidized, forming the mixed oxidized thin film 4.

Figure 10G:
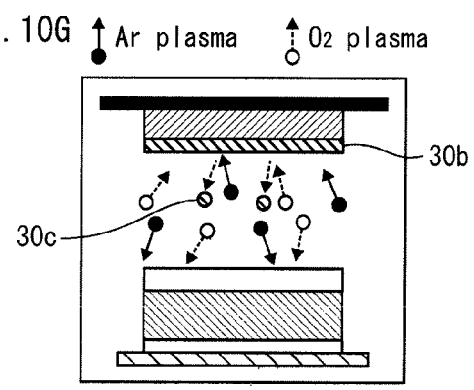
Figure 10D:
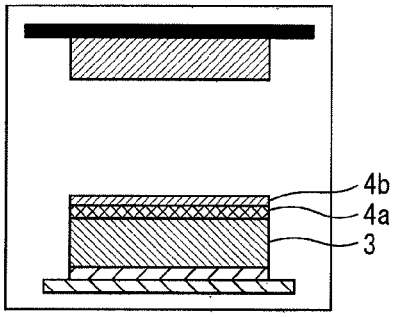
Figure 10H:
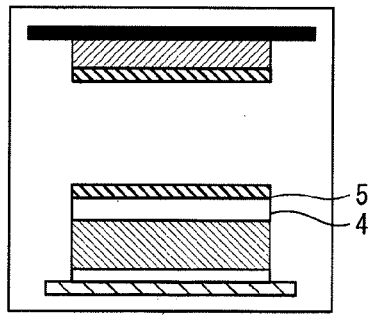

After this, as shown in FIG. 10G and FIG. 10H, a process of forming a transition metal oxide layer is performed, and the transition metal oxide layer is formed on the mixed oxidized thin film 4, which is the same as in the thin film formation method pertaining to embodiment 1.

FIGS. 11A and 11B are conceptual diagrams for describing the oxidization process for producing the mixed oxidized thin film pertaining to embodiment 2. In the second process, by depositing sputter particles composed of tungsten on the surface of the bottom electrode 3 composed of aluminium, for example, the mixed layer 4a is formed as shown in FIG. 11A. The mixed layer 4a is formed by the tungsten in the sputter particles mixing with the aluminium in the bottom electrode 3 to a depth of several nanometers due to the ion bombardment. By further causing the sputter particles to be deposited the metal layer 4b is formed, which is composed of the tungsten in the sputter particles. In this state, by performing reactive sputtering in the third process, as shown in FIG. 11B, the tungsten in the metal layer 4b and the tungsten and aluminium in the mixed layer 4a are (i) mixed to a depth of several nanometers by the ion bombardment, and (ii) oxidized by the oxygen plasma process, thereby forming the mixed oxidized thin film 4. Note that in the case of forming the transition metal oxide layer in the third process, oxidization also occurs due to the transition metal oxide that is deposited.

<Thin Film Formation Method Pertaining to Embodiment 3>

A thin film formation method pertaining to embodiment 3 is very different from the thin film formation method pertaining to embodiment 2 in that in the second process the mixed layer 4a is not formed. The mixed layer 4a is formed in the thin film formation method pertaining to embodiment 2. Only this difference is described below, and other points are abbreviated.

In the thin film formation method pertaining to embodiment 3, a first process, a second process, and a third process are performed in the stated order. The first process, the second process, and the third process are described below. FIGS. 12A through 12G are process diagrams for describing the thin film formation method pertaining to one aspect of the present invention. The first process, the second process, and the third process are described using FIGS. 12A through 12G.

Figure 12A:
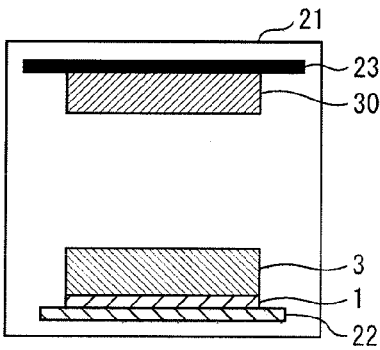
FIGS. 12A through 12G are process diagrams for describing a thin film formation method pertaining to embodiment 3.

In the first process, as in embodiment 2 and as shown in FIG. 12A, the substrate 1, on which is formed the bottom electrode 3 composed of the metal or alloy, is placed on the substrate holder 22. Also, the target material 30 composed of a transition metal or an alloy of the transition metal is placed on the target holder 23. In the vacuum container 21, the substrate 1 and the target material 30 are made to face each other.

Figure 12E:
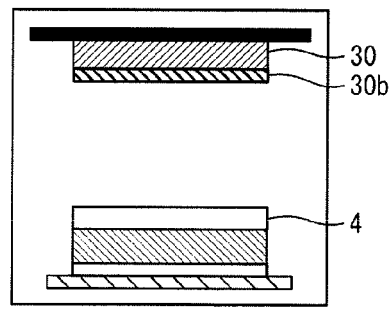
Figure 12B:
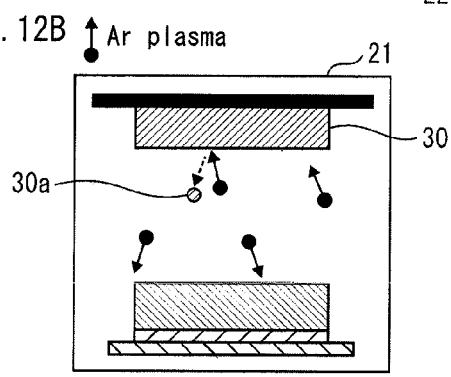

In the second process, as shown in FIG. 12B, under a condition in which oxygen is not present in the vacuum container 21, or oxygen is present at a level that does not oxidize the bottom electrode 3, sputtering is performed on the target material 30, causing the sputter particles 30a of the transition metal to be deposited on the surface of the bottom electrode 3. As shown in FIG. 12C, the metal layer 4b is formed on the bottom electrode 3.

Specifically, when causing the sputter particles 30a to be deposited on the surface of the bottom electrode 3, mixing of the transition metal in the sputter particles 30a and the metal or alloy in the bottom electrode 3 is avoided by suppressing the ion bombardment. Thus, the metal layer 4b composed of the transition metal in the sputter particles 30a is formed. The ion bombardment can be suppressed by adjusting the sputtering conditions.

The average film thickness of the metal layer 4b is preferably equal to or less than 1 nm. As long as the average film thickness of the metal layer 4b is equal to or less than 1 nm, the transition metal in the metal layer 4b can be mixed with the metal or alloy in the bottom electrode 3, by the ion bombardment caused by sputtering of the third process. Note that the average film thickness of the metal layer 4b can be adjusted by adjusting sputtering conditions.

Figure 12F:
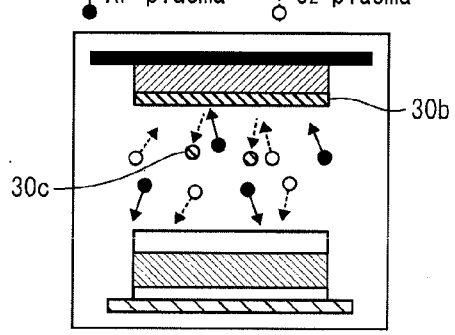
Figure 12C:
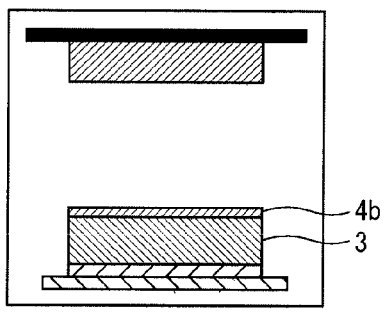
Figure 12G:
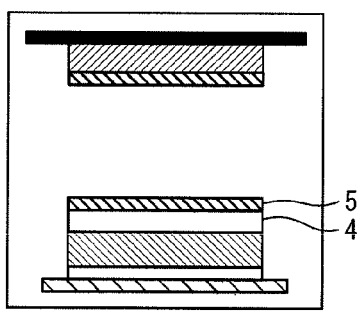
Figure 12D:
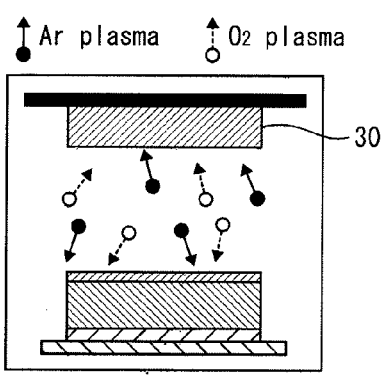

In the third process, after the second process, the target material 30 is sputtered under a condition in which oxygen is present in the vacuum container 21, as shown in FIG. 12D. In the third process, the metal layer 4b and the surface of the bottom electrode 3 are oxidized, forming the mixed oxidized thin film 4, as shown in FIG. 12E.

Specifically, the oxygen plasma process is performed while mixing the transition metal in the metal layer 4b, and the metal or alloy in the bottom electrode 3 due to the ion bombardment caused by sputtering. In this way, the metal layer 4b and the surface of the bottom electrode 3 are mixed and oxidized, forming the mixed oxidized thin film 4.

After this, as shown in FIG. 12F and FIG. 12G, a process of forming a transition metal oxide layer is performed. The method of forming the transition metal oxide layer on the mixed oxidized thin film 4 is the same as the thin film formation method pertaining to embodiment 2.

FIGS. 13A and 13B are conceptual diagrams for describing the oxidization process for producing the mixed oxidized thin film pertaining to embodiment 3. In the second process, as shown in FIG. 13A for example, by causing the sputter particles that are composed of tungsten to be deposited on the surface of the bottom electrode 3 that is composed of aluminium, the metal layer 4b is formed, which is composed of the tungsten in the sputter particles. In this state, by performing reactive sputtering in the third process, as shown in FIG. 13B, the tungsten in the metal layer 4b and the aluminium in the bottom electrode 3 are mixed to a depth of several nanometers by the ion bombardment, and are oxidized by the oxygen plasma process, thereby forming the mixed oxidized thin film 4. Note that in the case of forming the transition metal oxide layer in the third process, oxidization of the metal layer 4b also occurs due to the transition metal oxide that is deposited thereon.

The mixed oxidized thin film 4 formed in this way preferably has a film thickness such that oxidization of the transition metal in the metal layer 4b by the transition metal oxide is possible. As long as the mixed oxidized thin film 4 has such a thickness, the transition metal component of the mixed oxidized thin film 4 has a high chance of being sufficiently oxidized. Specifically, the metal layer 4b preferably has a film thickness such that the transition metal in the metal layer 4b can be oxidized into an oxide of the transition metal via the oxygen plasma process in the third process.

<Thin Film Formation Method Summary>

The thin film formation method pertaining to an aspect of the present invention, which is exemplified by the above embodiments 1-3, comprises: sputtering the target member under a first condition in which oxygen is not present in the vacuum container or is present at a level that does not oxidize the thin layer, depositing sputter particles of the transition metal on a surface of the thin layer; and after sputtering under the first condition, sputtering the target member under a second condition in which oxygen is present in the vacuum container at a level that oxidizes the thin layer, oxidizing the metal or alloy and the deposited transition metal in a mixed state and forming a mixed oxidized thin film on the thin layer. Thus, formation is suppressed of an oxidized layer composed of an oxide of the metal or alloy on the surface of the thin layer.

In other words, since the mixed oxidized thin film is formed on the thin layer, even if sputtering is later performed under a condition in which oxygen is present, exposure of the surface of the thin layer to oxygen plasma is unlikely, making oxidization of the surface of the thin layer by the oxygen plasma unlikely. Thus, formation of an oxidized film composed of an oxide of the metal or alloy on the thin layer is unlikely. Further, since the mixed oxidized thin film is formed by oxidization in a mixed state of the metal or alloy, and the transition metal, the mixed oxidized thin film is characterized in that it is difficult for the thin layer to take oxygen therefrom. Thus, oxidization of the surface of the thin layer is not accelerated. Thus, even when the mixed oxidized thin film is formed in contact with the surface of the thin layer, an oxidized layer composed of an oxide of the metal or alloy forming due to oxidization of the surface of the thin layer is unlikely.

[Experiments]

<Mixed Oxidized Thin Film Cross-Sections>

Figure 14A:
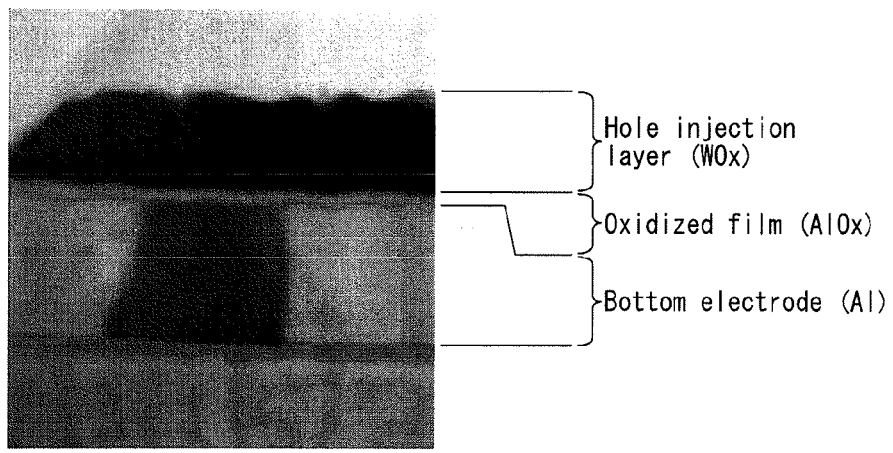
FIGS. 14A through 14C are electron micrographs showing cross-sections near surfaces of bottom electrodes.
Figure 14B:
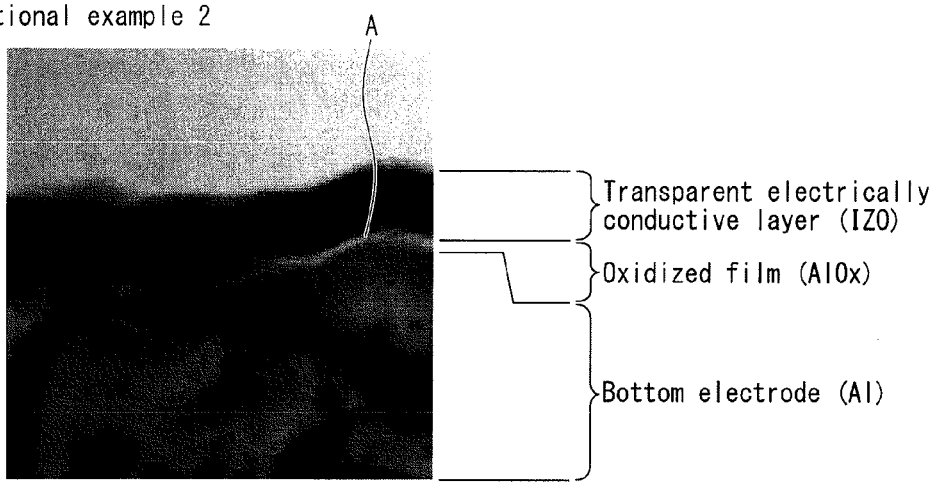
Figure 14C:
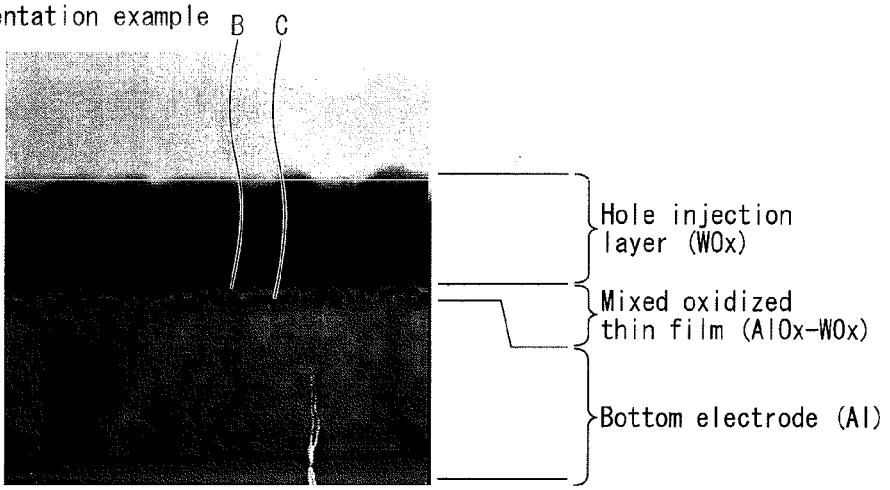

Using a transmission electron microscope (TEM), cross-sections of mixed oxidized thin films were observed. FIGS. 14A through 14C are electron micrographs showing cross-sections near the surfaces of bottom electrodes. FIG. 14A shows a conventional example 1, in which a hole-injection layer was formed directly on a bottom electrode. FIG. 14B shows a conventional example 2, in which a hole-injection layer was formed after formation of a light-transmissive electrically-conductive layer composed of IZO on a bottom electrode. FIG. 14C shows an implementation example pertaining to the present invention, in which a hole-injection layer was formed after formation of a mixed oxidized thin film having an average thickness of 1 nm on a bottom electrode.

As shown in FIG. 14A, in the conventional example 1 an oxidized film is formed on the bottom electrode. As shown in FIG. 14B, in the conventional example 2 an oxidized film is also formed on the bottom electrode. In contrast, as shown in FIG. 14C, in the implementation example the mixed oxidized thin film, which is a mix of aluminium oxide and tungsten oxide, is formed on the bottom electrode.

As shown in FIG. 14C, in the mixed oxidized thin film, white color portions and black color portions are mixed together. The white color portions suggest Al, which is a light metal, as a primary component, and the black color portions suggest W, which is a heavy metal, as a primary component. In this way it is understood that Al and W are mixed in the mixed oxidized thin film. In contrast, the oxidized films shown in FIG. 14A and FIG. 14B differ from the mixed oxidized thin film of the implementation example in that they are made only of white portions that are primarily Al. Thus, it is understood that W is hardly present in these oxidized films.

Figure 15A:
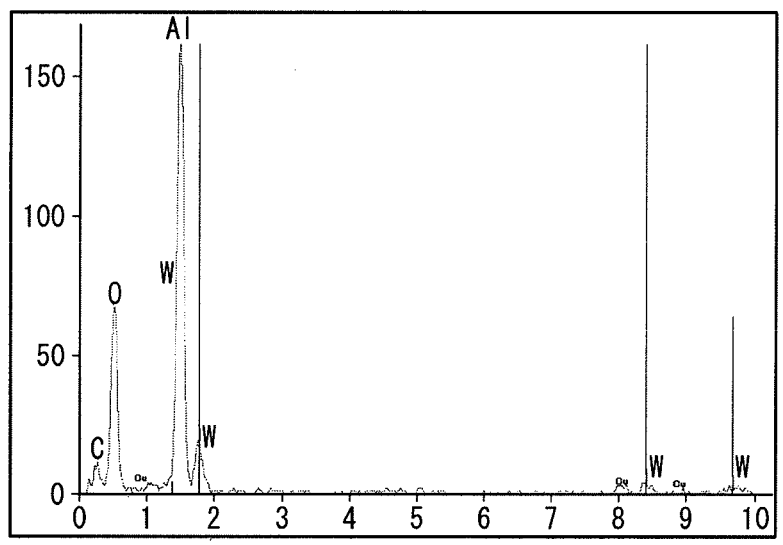
FIGS. 15A through 15C are diagrams showing results of EDS analysis of an oxidized film and a mixed oxidized thin film.
Figure 15B:
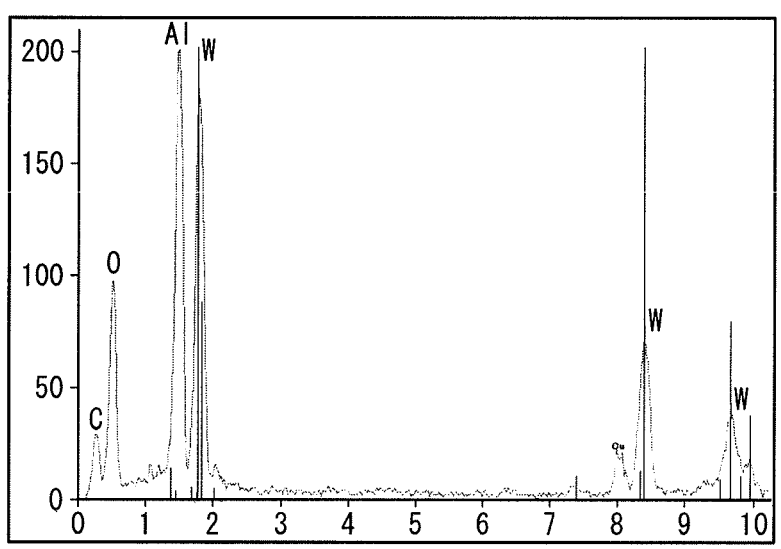
Figure 15C:
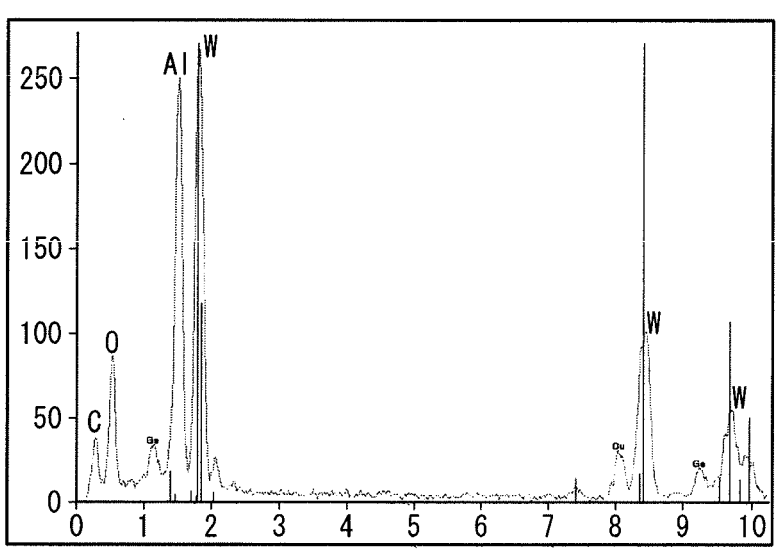

Next, the mixed oxidized thin film and an oxidized film were analyzed using energy-dispersive X-ray spectroscopy (EDS). FIGS. 15A through 15C are diagrams showing results of the EDS analysis of the oxidized film and the mixed oxidized thin film.

The oxidized film of the conventional example 2 (a portion indicated by the symbol A in FIG. 14B) was, as shown in FIG. 15A, almost entirely composed of Al and O (oxygen atoms), and the W content was low. This kind of oxidized film composed of aluminium oxide ($AlO_x$) is commonly known to have poor electrical conductivity.

On the other hand, the white portion of the mixed oxidized thin film of the implementation example (a portion indicated by the symbol B in FIG. 14C) was, as shown in FIG. 15B, a mix of both Al and W, and O was also present. Further, the black portion of the mixed oxidized thin film of the implementation example (a portion indicated by the symbol C in FIG. 14C) was, as shown in FIG. 15C, a mix of both Al and W, and O was also present. Accordingly, the results suggest that in the mixed oxidized thin film Al and W exist in a mixed, oxidized state.

The above-described implementation example is a case in which the hole-injection layer was formed after the mixed oxidized thin film having an average thickness of 1 nm was formed on the bottom electrode. However, as different implementation examples, a case in which the mixed oxidized thin film has an average thickness of 3 nm and a case in which the mixed oxidized thin film has an average thickness of 5 nm were observed in cross-section and subjected to EDS analysis.

Figure 16:
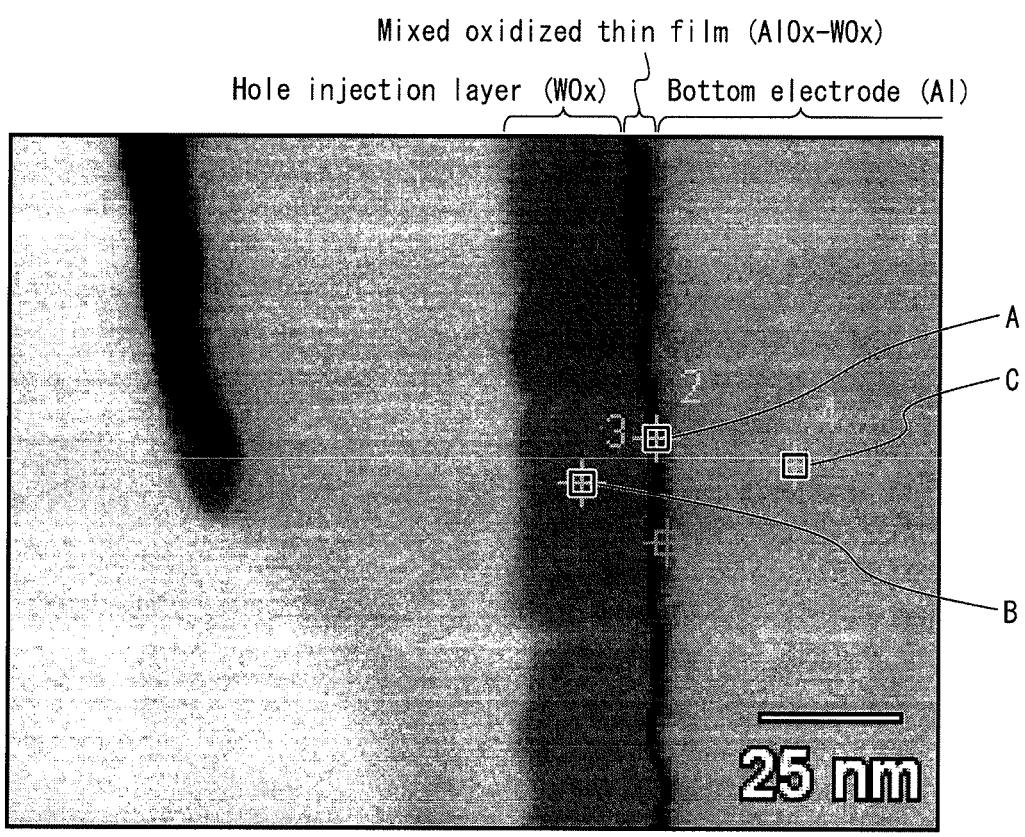
FIG. 16 is an electron micrograph of a case in which an average thickness of the mixed oxidized thin film is 3 nm.
Figure 17A:
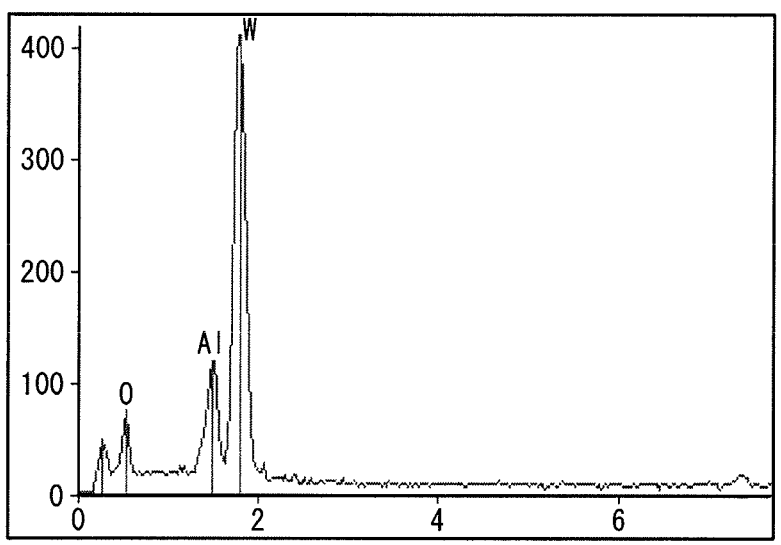
FIGS. 17A through 17C are diagrams showing results of EDS analysis of cases in which the average thickness of the mixed oxidized thin film is 3 nm.
Figure 17B:
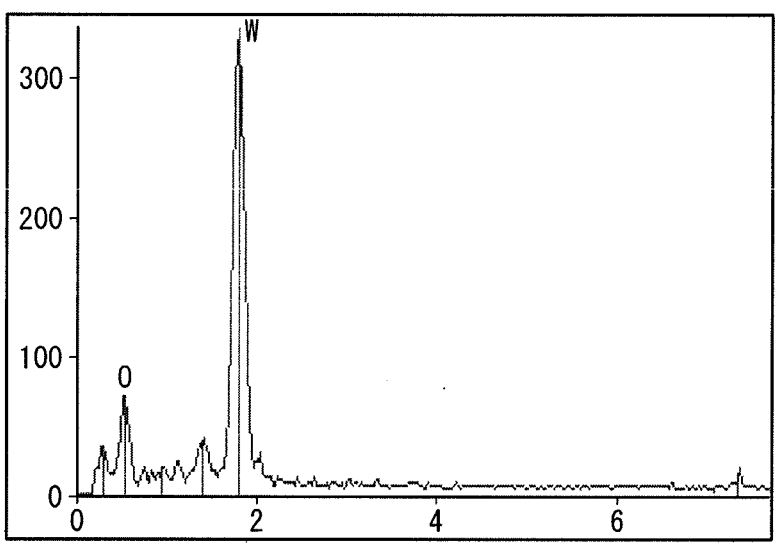
Figure 17C:
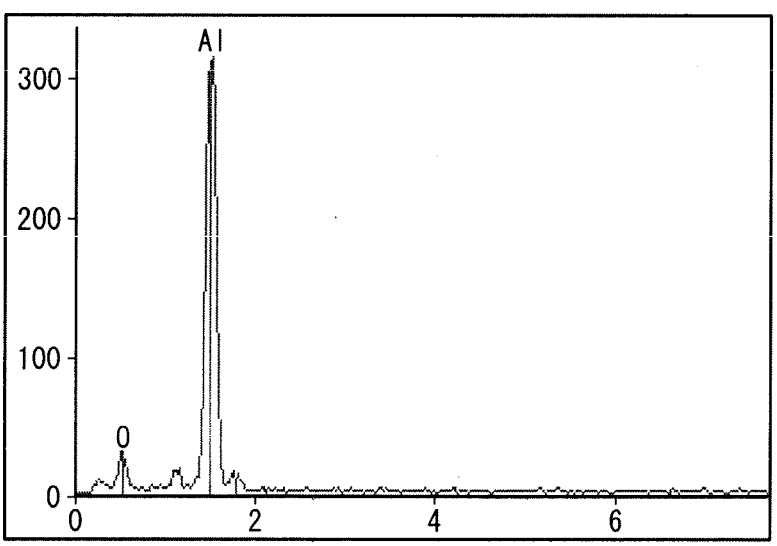

FIG. 16 is an electron micrograph of a case in which the average thickness of the mixed oxidized thin film is 3 nm. FIGS. 17A through 17C are diagrams showing results of EDS analysis of the case in which the average thickness of the mixed oxidized thin film is 3 nm. FIG. 17A shows an analysis result of a portion indicated by the symbol A in FIG. 16. FIG. 17B shows an analysis result of a portion indicated by the symbol B in FIG. 16. FIG. 17C shows an analysis result of a portion indicated by the symbol C in FIG. 16.

Similar to the case described above, in the case in which the mixed oxidized thin film has an average thickness of 3 nm, both Al and W are mixed, and O is also present in the mixed oxidized thin film, as shown in FIG. 17A. Further, as shown in FIG. 17B, the hole-injection layer is composed of W and O.

Figure 18:
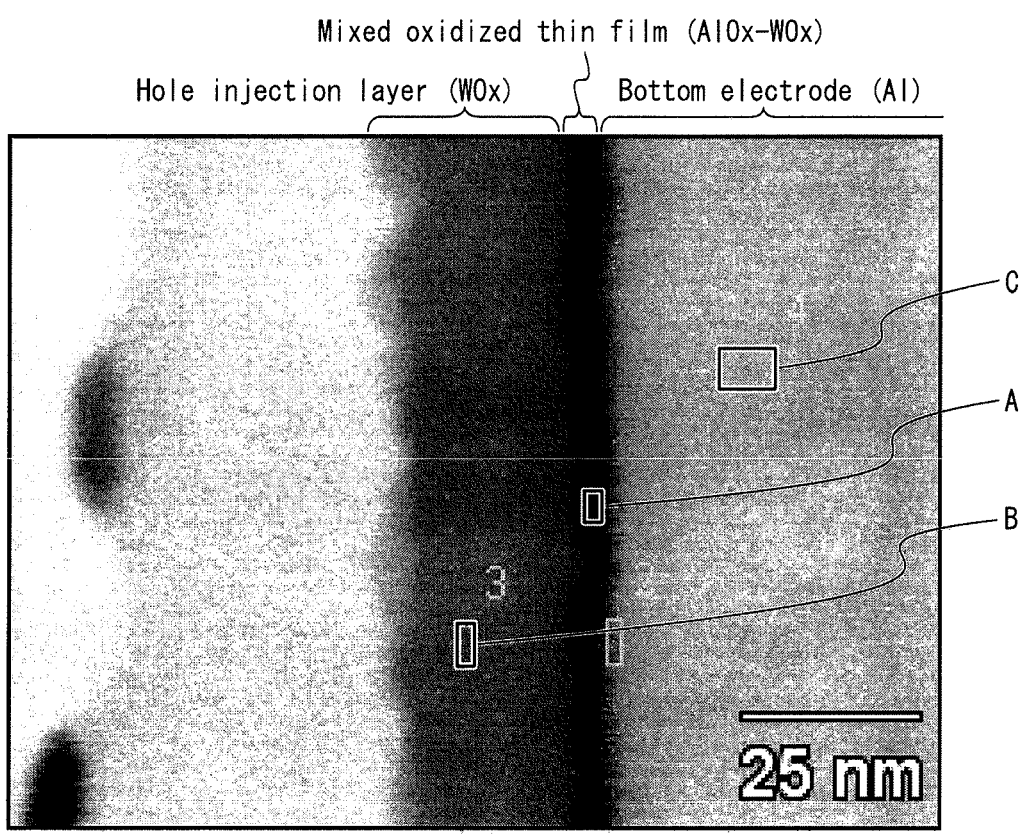
FIG. 18 is an electron micrograph of a case in which the average thickness of the mixed oxidized thin film is 5 nm.
Figure 19A:
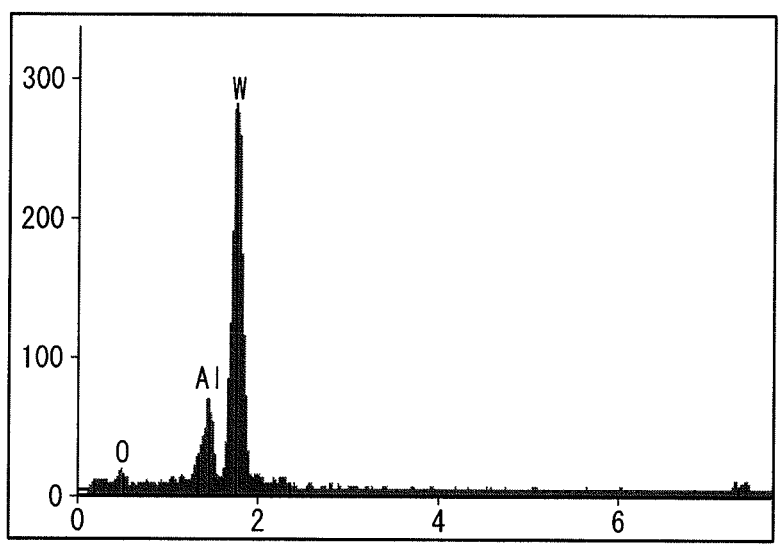
FIGS. 19A through 19C are diagrams showing results of EDS analysis of cases in which the average thickness of the mixed oxidized thin film is 5 nm.
Figure 19B:
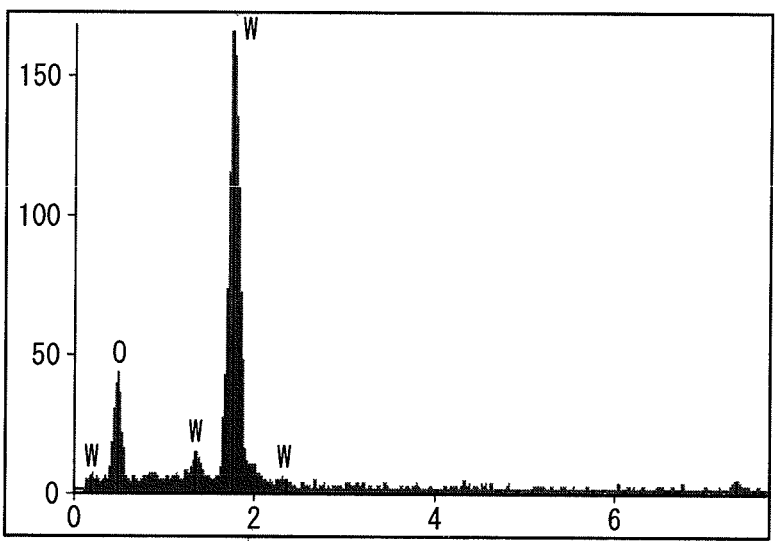
Figure 19C:
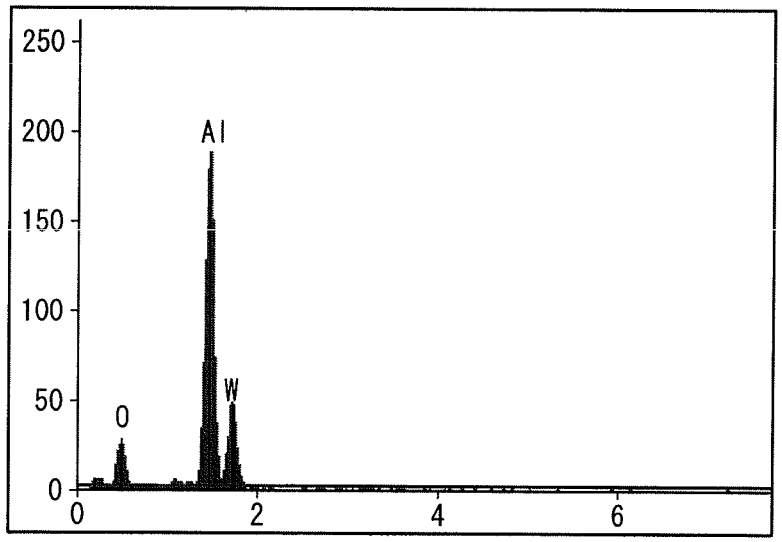

FIG. 18 is an electron micrograph of a case in which the average thickness of the mixed oxidized thin film is 5 nm. FIGS. 19A through 19C are diagrams showing results of EDS analysis of the case in which the average thickness of the mixed oxidized thin film is 5 nm. FIG. 19A shows an analysis result of a portion indicated by the symbol A in FIG. 18. FIG. 19B shows an analysis result of a portion indicated by the symbol B in FIG. 18. FIG. 19C shows an analysis result of a portion indicated by the symbol C in FIG. 18.

Similar to the cases described above, in the case in which the mixed oxidized thin film has an average thickness of 5 nm, both Al and W are mixed, and O is also present in the mixed oxidized thin film, as shown in FIG. 19A. Further, as shown in FIG. 19B, the hole-injection layer is composed of W and O. As shown in FIG. 19C, the bottom electrode is composed of Al and O.

As shown in FIGS. 19A, 19B, 19C, in the case in which the average thickness of the mixed oxidized thin film is 5 nm, a ratio of O to W contained in the mixed oxidized thin film was less than in the case in which the average thickness of the mixed oxidized thin film is 3 nm. In other words, it can be seen that if the average film thickness becomes thicker than 5 nm, the film becomes more like the metal W. By becoming more like the metal W, the reflectance decreases, and therefore the thickness of the mixed oxidized thin film is preferably equal to or less than 5 nm.

<Results of Oxidization by Reactive Sputtering>

Figure 20A:
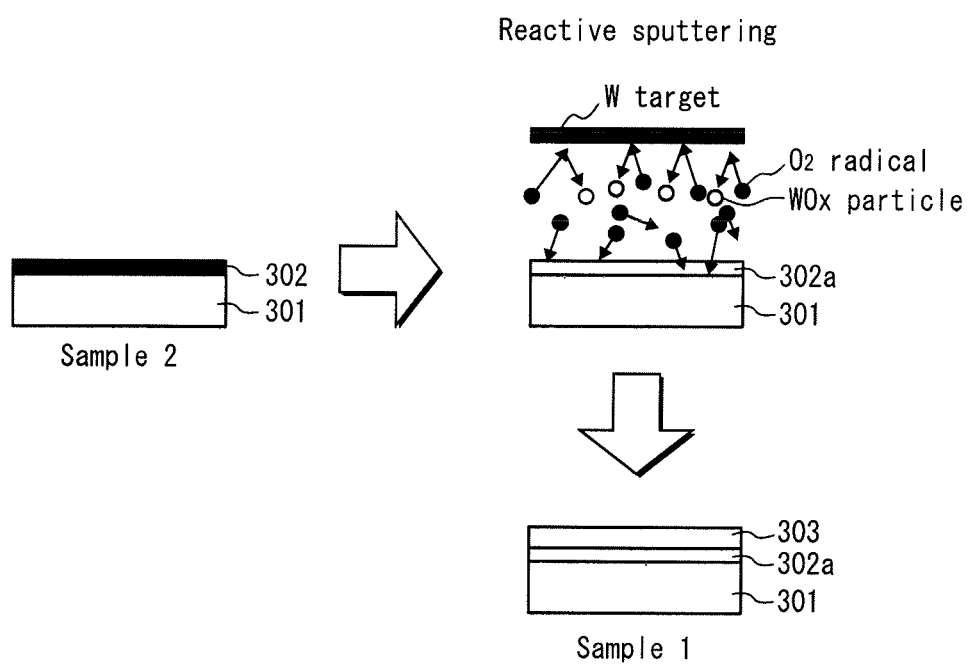
FIGS. 20A and 20B are diagrams for describing oxidization of a transition metal deposited on the surface of the bottom electrode, due to reactive sputtering.
Figure 20B:
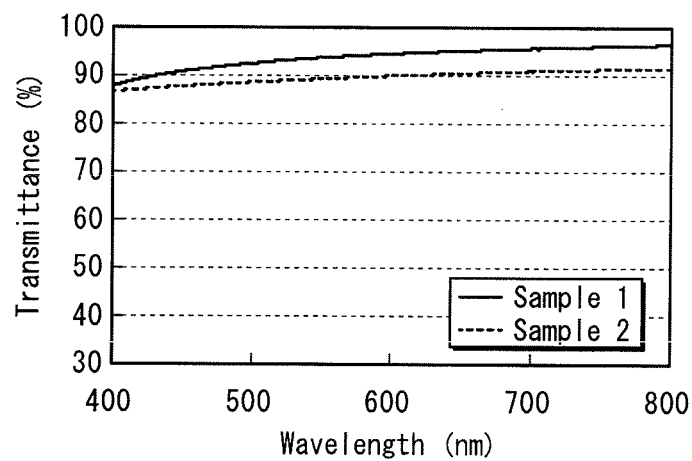

Next, it was confirmed through experimentation that light transmittance of a metal layer composed of a transition metal increases when the metal layer is oxidized by reactive sputtering. FIGS. 20A and 20B are diagrams for describing results of oxidization due to reactive sputtering.

In an experiment, as shown in FIG. 20A, a sample 1 was manufactured by (i) forming a transition metal layer 302 composed of tungsten and having an average thickness of 1 nm on a glass substrate 301 having a thickness of 0.7 mm, and (ii) forming a transition metal oxide layer 303 composed of oxidized tungsten and having an average thickness of 12 nm on the transition metal layer 302 by reactive sputtering. Further, a sample 2 was manufactured by forming the transition metal layer 302 composed of tungsten and having an average thickness of 1 nm on the glass substrate 301 having a thickness of 0.7 mm. Then, by measuring light transmittance of both samples, results were obtained as shown in FIG. 20B.

As shown in FIG. 20B, when comparing the light transmittance of both samples, in wavelengths of 400 to 800 nm, sample 1 had a higher light transmittance than sample 2. Especially in the range of wavelengths of 600 to 800 nm, the light transmittance of sample 1 was at least 5% higher than the light transmittance of sample 2. These results demonstrate that oxidizing a metal layer composed of a transition metal by reactive sputtering increases light transmittance.

As a reason for the difference in light transmittance of the samples, it is thought that when the reactive sputtering forms the transition metal oxide layer 303, this causes the transition metal layer 302 to be oxidized and become a transition metal oxide layer 302a. To explain in detail, first, the transition metal oxide layer 302a has a relatively high light transmittance. This is clear because the sample 1, in which the transition metal oxide layer 303 having an average thickness of 12 nm is formed, has a higher light transmittance than the sample 2, in which the transition metal oxide layer 303 is not formed. Next, the transition metal layer 302 has a lower light transmittance than the transition metal oxide layer 302a. From the above results it is considered that since in the sample 1 the transition metal layer 302, which has a low light transmittance, became the transition metal oxide layer 302a, which has a higher light transmittance, the sample 1 had a higher light transmittance than the sample 2, in which the transition metal layer 302 remained.

<Drive Voltage of Organic Light Emitting Element>

Figure 21:
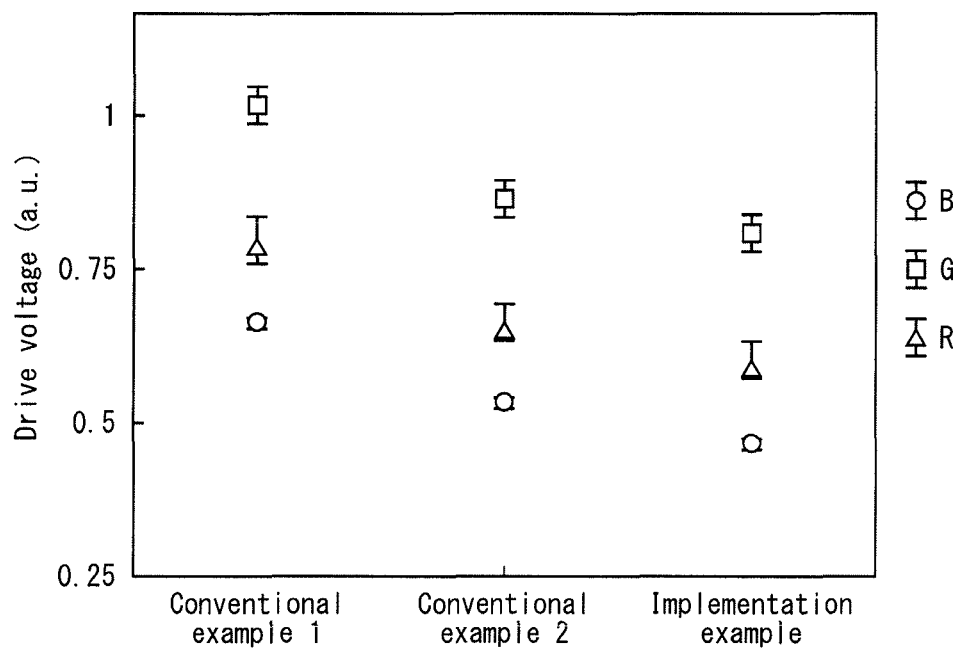
FIG. 21 is a diagram showing measurements of drive voltages of organic light emitting elements.

Next, the drive voltage was compared of an organic light emitting element using the structure of the above-described conventional example 1, an organic light emitting element using the structure of the above-described conventional example 2, and an organic light emitting element using the structure of the above-described implementation example. FIG. 21 is a diagram showing measurements of drive voltages of organic light emitting elements. As shown in FIG. 21, the organic light emitting element of the implementation example had a lower drive voltage than the organic light emitting element of the conventional example 1 and the organic light emitting element of the conventional example 2, whether emitting red (R) light, green (G) light, or blue (B) light. It is considered that this is because an oxidized film was not present on the bottom electrode 3, and therefore an increase in electrical resistance due to such an oxidized film did not occur.

<Light Emission Efficiency of Organic Light Emitting Element>

Figure 22:
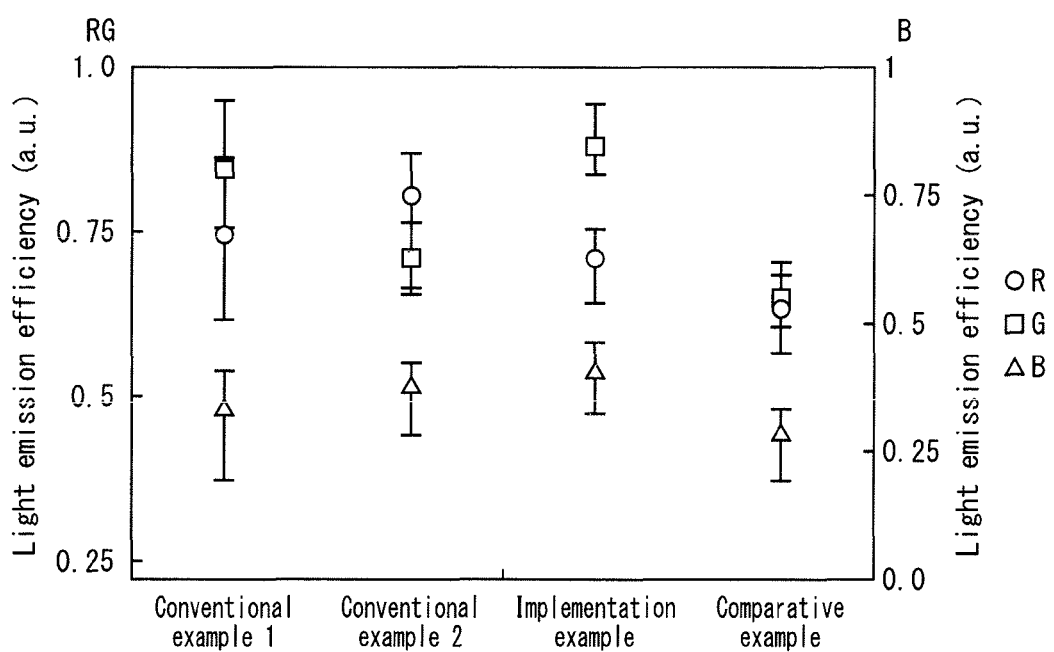
FIG. 22 is a diagram showing measurements of light emission efficiency of organic light emitting elements.
Figure 23A:
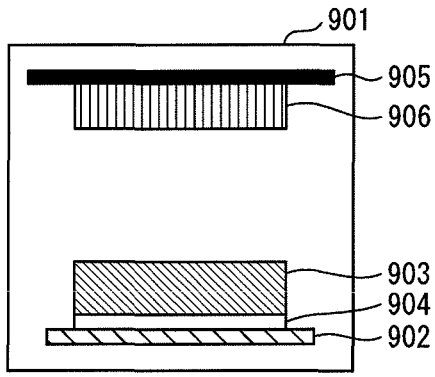
FIGS. 23A through 23D are process diagrams for describing a conventional thin film formation method.
Figure 23B:
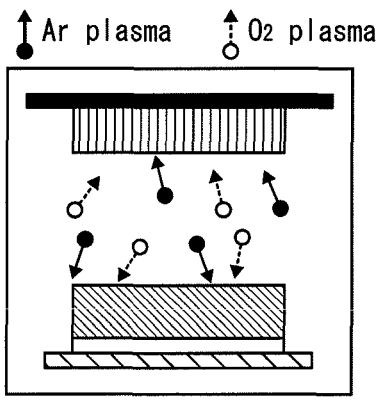
Figure 23C:
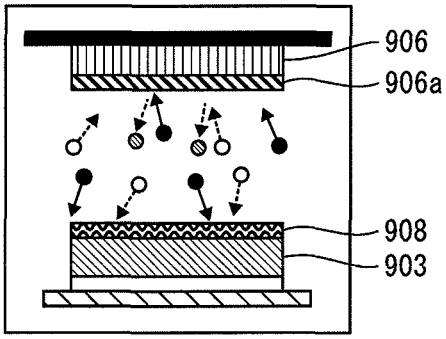
Figure 23D:
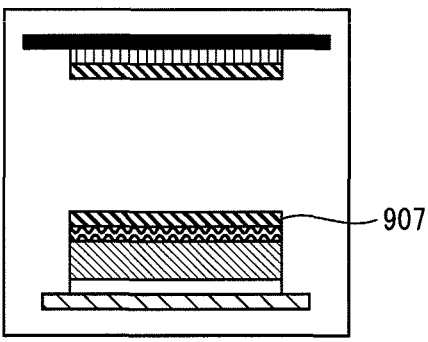

Next, the light emission efficiency was compared of an organic light emitting element using the structure of the above-described conventional example 1, an organic light emitting element using the structure of the above-described conventional example 2, and an organic light emitting element using the structure of the above-described implementation example. FIG. 22 is a diagram showing measurements of light emission efficiency of organic light emitting elements. As shown in FIG. 22, depending on the light emission color there was some variation in light emission efficiency. However, overall, the organic light emitting element of the implementation example had a higher light emission efficiency than the organic light emitting element of the conventional example 1 and the organic light emitting element of the conventional example 2.

Note that in the implementation example, the mixed oxidized thin film was formed by deposition of an amount of sputter particles that would result in a metal layer having an average thickness of equal to or less than 1 nm on a glass substrate. As a comparative example, an organic light emitting element in which the mixed oxidized thin film was formed by deposition of an amount of sputter particles that would result in a metal layer having an average thickness of equal to or less than 2 nm on a glass substrate was formed, and light emission efficiency was measured.

The light emission efficiency of the organic light emitting element of the comparative example was lower than the light emission efficiency of the organic light emitting element of the implementation example. This is considered to be because the transition metal of the deposited sputter particles were not sufficiently oxidized by the reactive sputtering such that a portion remained as the transition metal, decreasing the reflectance of the bottom electrode.

[Modifications]

The thin film formation method, manufacturing method of the organic display panel, manufacturing method of the organic display device, manufacturing method of the organic light emitting device, the organic display panel, the organic display device, and the organic light emitting device each pertaining to one aspect of the present invention are specifically described above. However, the above-described embodiments are examples used to describe the structure and effects of the present invention in a way that is easy to understand, and the present invention is not limited to the above-described embodiments.

For example, in the above-described embodiments, a light emission color of the organic display panel is not mentioned in detail, but the present invention may also be applied to a full-color display and a single-color display. In a full-color display type of organic display panel, organic light emitting elements correspond to sub-pixels of each color of RGB, and adjacent RGB sub-pixels combine to form a pixel. Pixels are arranged in a matrix to form an image display area.

INDUSTRIAL APPLICABILITY

The thin film formation method pertaining to one aspect of the present invention can be widely used in manufacturing processes of organic display panels manufactured by sputtering methods. Further, the manufacturing method of the organic display panel, the manufacturing method of the organic display device, the manufacturing method of the organic light emitting device, the organic display panel, the organic display device, and the organic light emitting device each pertaining to one aspect of the present invention can be widely used in, for example, the general fields of passive matrix type and active matrix type organic display devices and organic light emitting devices, etc.

REFERENCE SIGNS LIST 1 substrate
3 thin layer (bottom electrode)
4 mixed oxidized thin film
4a mixed layer
4b metal layer
5 transition metal oxide layer (hole-injection layer)
21 vacuum container
30 target material
110 organic display panel
100 organic display device
200 organic light emitting device

The invention claimed is:

1. An organic display panel comprising an organic light emitting element that includes a bottom electrode, a hole-injection layer, an organic light emitting layer, and a top electrode layered in the stated order on a substrate, wherein
    the bottom electrode is composed of a material that is aluminium, silver, or an alloy including at least one of aluminium and silver,
    the hole-injection layer contains an oxide of a transition metal, and
    the organic light emitting element further includes a mixed oxidized thin film interposed between and in contact with the bottom electrode and the hole-injection layer, the mixed oxidized thin film being composed of an oxidized mixture of the material contained in the bottom electrode and the transition metal contained in the hole-injection layer.

2. The organic display panel of claim 1, wherein the mixed oxidized thin film has a film thickness that allows the transition metal in the mixed oxidized thin film to oxidize into an oxide of the transition metal.

3. The organic display panel of claim 1, wherein the transition metal is tungsten, molybdenum, or nickel.

4. An organic display device comprising an organic light emitting element that includes a bottom electrode, a hole-injection layer, an organic light emitting layer, and a top electrode layered in the stated order on a substrate, wherein
the bottom electrode is composed of a material that is aluminium, silver, or an alloy including at least one of aluminium and silver,
the hole-injection layer contains an oxide of a transition metal, and
the organic light emitting element further includes a mixed oxidized thin film interposed between and in contact with the bottom electrode and the hole-injection layer, the mixed oxidized thin film being composed of an oxidized mixture of the material contained in the bottom electrode and the transition metal contained in the hole-injection layer.

5. An organic light emitting device comprising an organic light emitting element that includes a bottom electrode, a hole-injection layer, an organic light emitting layer, and a top electrode layered in the stated order on a substrate, wherein
the bottom electrode is composed of a material that is aluminium, silver, or an alloy including at least one of aluminium and silver,
the hole-injection layer contains an oxide of a transition metal, and
the organic light emitting element further includes a mixed oxidized thin film interposed between and in contact with the bottom electrode and the hole-injection layer, the mixed oxidized thin film being composed of an oxidized mixture of the material contained in the bottom electrode and the transition metal contained in the hole-injection layer.

6. A manufacturing method of an organic display panel, comprising:
placing in a vacuum container a substrate on which a bottom electrode has been formed and a target member, the bottom electrode being composed of a material that is aluminium, silver, or an alloy including at least one of aluminium and silver, and the target member being composed of a transition metal or an alloy of the transition metal;
sputtering the target member under a first condition in which oxygen is not present in the vacuum container or is present at a level that does not oxidize the bottom electrode, depositing sputter particles of the transition metal on a surface of the bottom electrode; and
after sputtering under the first condition, sputtering the target member under a second condition in which oxygen is present in the vacuum container at a level that oxidizes the bottom electrode, oxidizing the material and the deposited transition metal in a mixed state and forming a mixed oxidized thin film on the bottom electrode.

7. A manufacturing method of an organic display device, comprising:
placing in a vacuum container a substrate on which a bottom electrode has been formed and a target member, the bottom electrode being composed of a material that is aluminium, silver, or an alloy including at least one of aluminium and silver, and the target member being composed of a transition metal or an alloy of the transition metal;
sputtering the target member under a first condition in which oxygen is not present in the vacuum container or is present at a level that does not oxidize the bottom electrode, depositing sputter particles of the transition metal on a surface of the bottom electrode; and
after sputtering under the first condition, sputtering the target member under a second condition in which oxygen is present in the vacuum container at a level that oxidizes the bottom electrode, oxidizing the material and the deposited transition metal in a mixed state and forming a mixed oxidized thin film on the bottom electrode.

8. A manufacturing method of an organic light emitting device, comprising:
placing in a vacuum container a substrate on which a bottom electrode has been formed and a target member, the bottom electrode being composed of a material that is aluminium, silver, or an alloy including at least one of aluminium and silver, and the target member being composed of a transition metal or an alloy of the transition metal;
sputtering the target member under a first condition in which oxygen is not present in the vacuum container or is present at a level that does not oxidize the bottom electrode, depositing sputter particles of the transition metal on a surface of the bottom electrode; and
after sputtering under the first condition, sputtering the target member under a second condition in which oxygen is present in the vacuum container at a level that oxidizes the bottom electrode, oxidizing the material and the deposited transition metal in a mixed state and forming a mixed oxidized thin film on the bottom electrode.

9. A thin film formation method comprising:
placing in a vacuum container a substrate on which a thin layer has been formed and a target member, the thin layer being composed of a material that is aluminium, silver, or an alloy including at least one of aluminium and silver, and the target member being composed of a transition metal or an alloy of the transition metal;
sputtering the target member under a first condition in which oxygen is not present in the vacuum container or is present at a level that does not oxidize the thin layer, depositing sputter particles of the transition metal on a surface of the thin layer; and
after sputtering under the first condition, sputtering the target member under a second condition in which oxygen is present in the vacuum container at a level that oxidizes the thin layer, oxidizing the material and the deposited transition metal in a mixed state and forming a mixed oxidized thin film on the thin layer.

10. The thin film formation method of claim 9, wherein
the sputtering under the first condition forms a mixed layer on the thin layer, the mixed layer being composed of a mix of the material and the transition metal, and
the sputtering under the second condition oxidizes the mixed layer, forming the mixed oxidized thin film.

11. The thin film formation method of claim 10, wherein the mixed layer has an average thickness equal to or less than 5 nm.

12. The thin film formation method of claim 9, wherein the sputtering under the first condition forms a mixed layer and a metal layer on the thin layer, the mixed layer being composed of a mix of the material and the transition metal, the metal layer being composed of the transition metal and formed on the mixed layer, and the sputtering under the second condition mixes and oxidizes the mixed layer and the metal layer, forming the mixed oxidized thin film.

13. The thin film formation method of claim 12, wherein a sum of an average thickness of the mixed layer and an average thickness of the metal layer is equal to or less than 3 nm, and the average thickness of the metal layer is equal to or less than 1 nm.

14. The thin film formation method of claim 9, wherein the sputtering under the first condition forms a metal layer composed of the transition metal on the thin layer, and the sputtering under the second condition oxidizes the metal layer, forming the mixed oxidized thin film.

15. The thin film formation method of claim 14, wherein the metal layer has an average thickness equal to or less than 1 nm.

16. The thin film formation method of claim 9, wherein further sputtering under the second condition is performed after the forming of the mixed oxidized thin film, depositing sputter particles of an oxide of the transition metal on the mixed oxidized thin film and forming a transition metal oxide layer on the mixed oxidized thin film.

17. The thin film formation method of claim 16, wherein the transition metal oxide layer has hole injection properties.

18. The thin film formation method of claim 17, wherein the transition metal is tungsten, molybdenum, or nickel.

19. The thin film formation method of claim 9, wherein the sputtering under the first condition is performed by using plasma of an inert gas.

20. The thin film formation method of claim 19, wherein the inert gas is argon gas.

* * * * *